(12) United States Patent
Kamada et al.

(10) Patent No.: US 12,230,485 B2
(45) Date of Patent: Feb. 18, 2025

(54) SPUTTERING TARGET FOR MAGNETIC RECORDING MEDIUM

(71) Applicant: TANAKA KIKINZOKU KOGYO K.K., Tokyo (JP)

(72) Inventors: Tomonari Kamada, Ibaraki (JP); Ryousuke Kushikibi, Ibaraki (JP)

(73) Assignee: TANAKA KIKINZOKU KOGYO K.K., Tokyo (JP)

( * ) Notice: Subject to any disclaimer, the term of this patent is extended or adjusted under 35 U.S.C. 154(b) by 233 days.

(21) Appl. No.: 17/628,065

(22) PCT Filed: Jul. 16, 2020

(86) PCT No.: PCT/JP2020/028611
§ 371 (c)(1),
(2) Date: Jan. 18, 2022

(87) PCT Pub. No.: WO2021/010490
PCT Pub. Date: Jan. 21, 2021

(65) Prior Publication Data
US 2022/0262608 A1    Aug. 18, 2022

(30) Foreign Application Priority Data

Jul. 18, 2019   (JP) .................. 2019-132859

(51) Int. Cl.
*H01J 37/34* (2006.01)
*C23C 14/34* (2006.01)
*G11B 5/65* (2006.01)

(52) U.S. Cl.
CPC ...... *H01J 37/3429* (2013.01); *C23C 14/3407* (2013.01); *G11B 5/656* (2013.01); *H01J 37/3426* (2013.01)

(58) Field of Classification Search
None
See application file for complete search history.

(56) References Cited

U.S. PATENT DOCUMENTS

| 2006/0042938 | A1  | 3/2006 | Cheng et al. |
| 2013/0206592 | A1  | 8/2013 | Arakawa et al. |
| 2019/0106783 | A1* | 4/2019 | Furuya .................. C23C 14/35 |
| 2020/0105297 | A1  | 4/2020 | Tham et al. |

FOREIGN PATENT DOCUMENTS

| CN | 1743497 A   | 3/2006 |
| CN | 103180481 A | 6/2013 |
| CN | 108884557 A | 11/2018 |

(Continued)

OTHER PUBLICATIONS

International Search Report issued in Application No. PCT/JP2020/028611, mailed Oct. 27, 2020.

(Continued)

*Primary Examiner* — Jason Berman
(74) *Attorney, Agent, or Firm* — MICHAEL BEST & FRIEDRICH LLP

(57) ABSTRACT

A sputtering target for a magnetic recording medium, comprises: a metal phase containing Pt and at least one or more selected from Mn and V, with the balance being Co and incidental impurities; and an oxide phase containing at least B and O.

8 Claims, 11 Drawing Sheets

(56) References Cited

FOREIGN PATENT DOCUMENTS

| CN | 109923610 A | | 6/2019 |
|---|---|---|---|
| JP | 2016160530 A | * | 9/2016 |
| WO | WO-2017/170138 A1 | | 10/2017 |
| WO | WO-2018/083951 A1 | | 5/2018 |

OTHER PUBLICATIONS

Oikawa et al, "Microstructure and Magnetic Properties of CoPtCr—$SiO_2$ Perpendicular Recording Media", IEEE Transactions on Magnetics, Sep. 2002, pp. 1976-1978, vol. 38, No. 5, DOI: 10.1109/TMAG.2002.801791, IEEE.

S. N. Piramanayagam, "Perpendicular recording media for hard disk drives", Applied Physics Reviews-Focused Review, Journal of Applied Physics, Accepted Mar. 2007, pp. 011301-1-011301-20, No. 102, DOI: 10.1063/1.2750414, AIP.

S. N. Piramanayagam et al., "Grain size reduction in CoCrPt: $SiO_2$ perpendicular recording media with oxide-based intermediate layers", Applied Physics Letters, Accepted Aug. 2006, pp. 162501-1-162501-2, No. 89, DOI: 10.1063/1.2362643, AIP.

Inaba et al, "Optimization of the $SiO_2$ Content in CoPtCr—$SiO_2$ Perpendicular Recording Media for High-Density Recording", IEEE Transactions on Magnetics, Jul. 2004, pp. 2486-2488, vol. 40, No. 4, DOI: 10.1109/TMAG.2004.832451, IEEE.

Tamai et al, "Magnetic and Recording Characteristics of CoCrPt-Oxide Media with a Mixture of $SiO_2$ and $TiO_2$", IEEE Transactions on Magnetics, Nov. 2008, pp. 3492-3495, vol. 44, No. 11, DOI: 10.1109/TMAG.2008.2002380, IEEE.

Office Action issued in Chinese Application No. 202080051547.8, dated Oct. 31, 2023.

* cited by examiner

SPUTTERING TARGET FOR MAGNETIC RECORDING MEDIUM

TECHNICAL FIELD

The present invention relates to a sputtering target for a magnetic recording medium and specifically relates to a sputtering target containing Co, Pt, and an oxide.

BACKGROUND ART

In a magnetic disk of a hard disk drive, information signals are recorded in tiny bits of a magnetic recording medium. To further increase the recording density of the magnetic recording medium, it is necessary to shrink the size of a bit that retains a piece of recorded information while enhancing a signal-to-noise ratio, which is an indicator of information quality. To enhance a signal-to-noise ratio, it is essential to increase a signal or to reduce a noise.

As a magnetic recording medium for recording information signals, a magnetic thin film having a CoPt-based alloy-oxide granular structure is used today (see Non Patent Literature (NPL) 1, for example). The granular structure is formed from columnar CoPt-based alloy grains and the surrounding oxide grain boundaries.

To increase the recording density of such a magnetic recording medium, it is necessary to smoothen transition regions between recording bits and thereby to reduce noise. To smoothen transition regions between recording bits, it is required to reduce the size of the CoPt-based alloy grains contained in the magnetic thin film.

Meanwhile, when the size of magnetic grains is reduced, the intensity of a recorded signal that can be retained by one magnetic grain decreases. To reduce the size of magnetic grains while ensuring the intensity of recorded signals, it is necessary to reduce the distance between grain centers.

Moreover, when the size of the CoPt-based alloy grains in the magnetic recording medium is reduced further, there arise in some cases so-called thermal fluctuations, in which recorded signals are lost due to thermal stability impaired by superparamagnetism. Such thermal fluctuations are a major obstacle to a higher recording density of a magnetic disk.

To overcome this obstacle, it is necessary to increase the magnetic energy in each CoPt-based alloy grain so as to predominate over the thermal energy. The magnetic energy of each CoPt-based alloy grain is determined by $v \times K_u$, which is the product of the volume v and the uniaxial magnetic anisotropy constant $K_u$ of the CoPt-based alloy grain. Accordingly, to increase the magnetic energy of the CoPt-based alloy grain, it is essential to increase the uniaxial magnetic anisotropy constant $K_u$ of the CoPt-based alloy grain (see NPL 2, for example).

Further, to grow columnar CoPt-based alloy grains having a large $K_u$, it is required to realize the phase separation between CoPt-based alloy grains and a grain boundary material. When intergranular interactions between CoPt-based alloy grains increase due to insufficient phase separation between CoPt-based alloy grains and a grain boundary material, a magnetic thin film having a CoPt-based alloy-oxide granular structure exhibits a low coercivity $H_c$. Consequently, thermal fluctuations tend to arise due to impaired thermal stability. Accordingly, it is also important to reduce intergranular interactions between CoPt-based alloy grains.

It may be possible to reduce the size of magnetic grains as well as the distance between the centers of the magnetic grains by reducing the size of grains in a Ru underlayer (underlayer provided for orientation control of a magnetic recording medium).

However, it is difficult to reduce the size of grains in a Ru underlayer while maintaining the crystal orientation (see NPL 3, for example). For this reason, the grain size in a Ru underlayer of current magnetic recording media is about 7 nm to 8 nm with little change from the size when longitudinal magnetic recording media were switched to perpendicular magnetic recording media.

Meanwhile, further reduction in size of magnetic grains has also been studied by improving a magnetic recording layer rather than a Ru underlayer. Specifically, in a CoPt-based alloy-oxide magnetic thin film, reduction in size of magnetic grains has been investigated by increasing the amount of an oxide to be added while reducing the volume ratio of the magnetic grains (see NPL 4, for example). By this technique, the size of the magnetic grains was reduced successfully. However, since the widths of grain boundaries increase in this technique as the amount of an oxide to be added increases, it is impossible to reduce the distance between the centers of the magnetic grains.

Furthermore, in addition to a single oxide used for conventional CoPt-based alloy-oxide magnetic thin films, addition of a second oxide has been investigated (see NPL 5, for example). However, when a plurality of oxide materials are to be added, guidelines for selecting such materials have not yet been clarified and oxides used as grain boundary materials for CoPt-based alloy grains remain under study even today. Meanwhile, the present inventors found the effectiveness of incorporating a low-melting oxide and a high-melting oxide (specifically, incorporating $B_2O_3$ having a melting point as low as 450° C. and a high-melting oxide having a melting point higher than a CoPt alloy (about 1,450° C.)) and have proposed a sputtering target for a magnetic recording medium, comprising a CoPt-based alloy and oxides including $B_2O_3$ and a high-melting oxide (Patent Literature (PTL) 1).

CITATION LIST

Patent Literature

PTL 1: WO 2018/083951

Non Patent Literature

NPL 1: T. Oikawa et al., IEEE Transactions on Magnetics, September 2002, Vol. 38, No. 5, pp. 1976-1978

NPL 2: S. N. Piramanayagam, Journal of Applied Physics, 2007, 102, 011301

NPL 3: S. N. Piramanayagam et al., Applied Physics Letters, 2006, 89, 162504

NPL 4: Y. Inaba et al., IEEE Transactions on Magnetics, July 2004, Vol. 40, No. 4, pp. 2486-2488

NPL 5: I. Tamai et al., IEEE Transactions on Magnetics, November 2008, Vol. 44, No. 11, pp. 3492-3495

SUMMARY OF INVENTION

Technical Problem

To further increase the capacity, an object of the present invention is to provide a sputtering target that is used for a magnetic recording medium and that can form a magnetic thin film having enhanced uniaxial magnetic anisotropy, reduced intergranular exchange coupling, and improved thermal stability and SNR (signal-to-noise ratio).

Solution to Problem

Different from the controlled oxide components employed in PTL 1, the present inventors focused on metal components and found possible, by using a sputtering target that comprises an alloy phase containing V or Mn, to minimize lowering in uniaxial magnetic anisotropy constant $K_u$ and to reduce α in a magnetic thin film to be obtained by sputtering. Consequently, the present inventors deemed possible to realize enhanced uniaxial magnetic anisotropy and reduced intergranular exchange coupling, thereby completing the present invention.

The present invention provides a sputtering target for a magnetic recording medium, comprising: a metal phase containing Pt and at least one or more selected from Mn and V, with the balance being Co and incidental impurities, and an oxide phase containing at least B and O.

It is preferable to contain, based on total metal phase components of the sputtering target for a magnetic recording medium, 1 mol % or more and 30 mol % or less of Pt and 0.5 mol % or more and 10 mol % or less of at least one or more selected from Mn and V; and to comprise, based on the sputtering target for a magnetic recording medium as a whole, 25 vol % or more and 40 vol % or less of the oxide phase.

Moreover, the present invention provides a sputtering target for a magnetic recording medium, comprising: a metal phase containing Pt, at least one or more selected from Mn and V, and at least one or more selected from Cr and Ru, with the balance being Co and incidental impurities; and an oxide phase containing at least B and O.

It is preferable to contain, based on total metal phase components of the sputtering target for a magnetic recording medium, 1 mol % or more and 30 mol % or less of Pt, 0.5 mol % or more and 10 mol % or less of at least one or more selected from Mn and V. and more than 0.5 mol % and 30 mol % or less of at least one or more selected from Cr and Ru; and to comprise, based on the sputtering target for a magnetic recording medium as a whole, 25 vol % or more and 40 vol % or less of the oxide phase.

The oxide phase containing at least B and O may further contain an oxide of at least one element selected from V. Ru, Ti, Si, Ta, Cr, Al, Nb, Mn, Co, Ni, Zn, Y, Mo. W, La, Ce, Nd, Sm, Eu, Gd, Yb, Lu, and Zr.

Further, the present invention provides a sputtering target for a magnetic recording medium, comprising: a metal phase containing Pt and at least one or more selected from Mn and V, with the balance being Co and incidental impurities; and an oxide phase.

It is preferable to contain, based on total metal phase components of the sputtering target for a magnetic recording medium, 1 mol % or more and 30 mol % or less of Pt and 0.5 mol % or more and 10 mol % or less of at least one or more selected from Mn and V; and to comprise, based on the sputtering target for a magnetic recording medium as a whole, 25 vol % or more and 40 vol % or less of the oxide phase.

Furthermore, the present invention provides a sputtering target for a magnetic recording medium, comprising: a metal phase containing Pt, at least one or more selected from Mn and V. and at least one or more selected from Cr and Ru, with the balance being Co and incidental impurities; and an oxide phase.

It is preferable to contain, based on total metal phase components of the sputtering target for a magnetic recording medium, 1 mol % or more and 30 mol % or less of Pt, 0.5 mol % or more and 10 mol % or less of at least one or more selected from Mn and V, and more than 0.5 mol % and 30 mol % or less of at least one or more selected from Cr and Ru; and to comprise, based on the sputtering target for a magnetic recording medium as a whole, 25 vol % or more and 40 vol % or less of the oxide phase.

The oxide phase may further contain an oxide of at least one element selected from B, V, Ru, Ti, Si, Ta, Cr, Al, Nb, Mn, Co, Ni, Zn, Y, Mo, W, La, Ce, Nd, Sm, Eu, Gd, Yb, Lu, and Zr.

Advantageous Effects of Invention

By using the sputtering target for a magnetic recording medium of the present invention, it is possible to produce a high-density magnetic recording medium that exhibits improved thermal stability and SNR due to enhanced uniaxial magnetic anisotropy and reduced intergranular exchange coupling.

DESCRIPTION OF EMBODIMENTS

Figure 1:
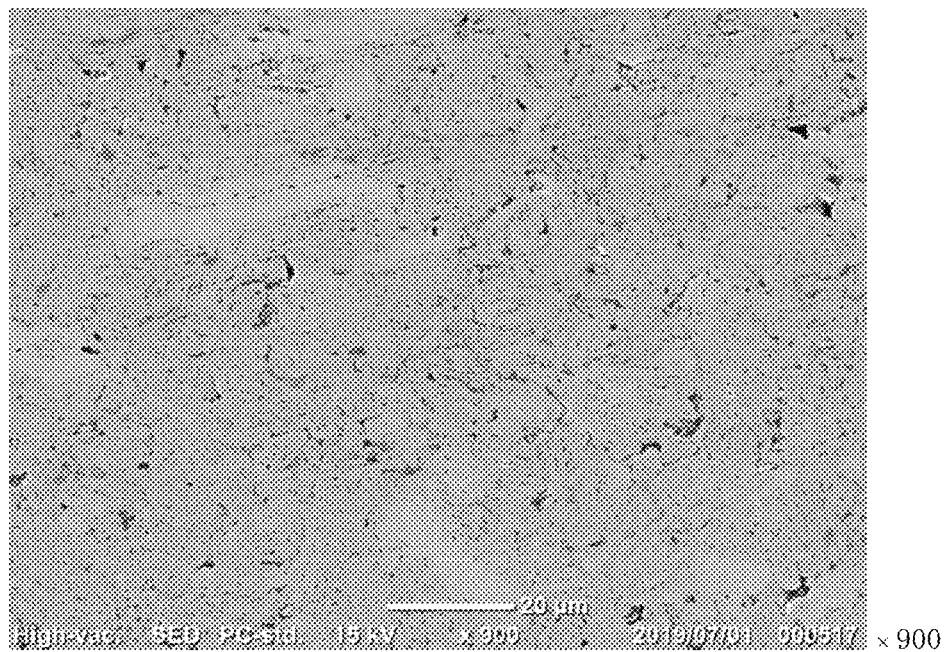
FIG. 1 is micrographs (top: ×900, bottom: ×3,000) by an SEM (accelerating voltage of 15 keV) for the cross-section in the thickness direction of a sintered test piece in Example 1.
Figure 1:
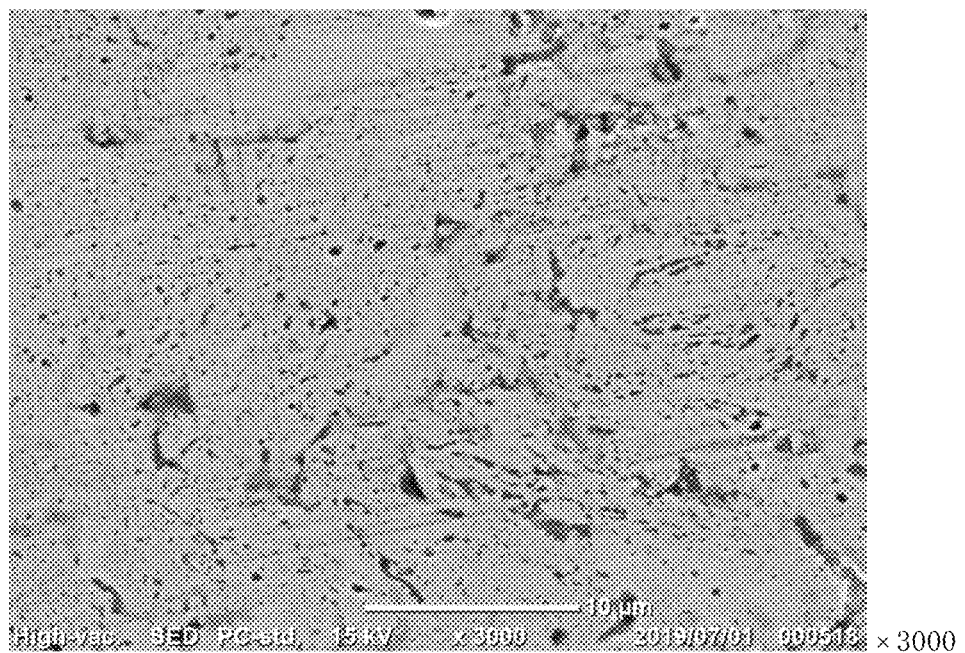

Hereinafter, the present invention will be described in detail with reference to the accompanying drawings. However, the present invention is not limited thereto. Herein, a sputtering target for a magnetic recording medium is simply referred to as a sputtering target or a target in some cases.

(1) First Embodiment

A sputtering target for a magnetic recording medium according to the first embodiment of the present invention is characterized by comprising: a metal phase containing Pt and at least one or more selected from Mn and V, with the balance being Co and incidental impurities; and an oxide phase containing at least B and O.

The target of the first embodiment preferably comprises the metal phase containing 1 mol % or more and 30 mol % or less of Pt and 0.5 mol % or more and 10 mol % or less of at least one or more selected from Mn and V, with the balance being Co and incidental impurities; and preferably comprises, based on the sputtering target for a magnetic recording medium as a whole, 25 vol % or more and 40 vol % or less of the oxide phase containing at least B and O.

The oxide phase containing B and O indicates a phase containing boron oxide. Although $B_2O_3$ is common as boron oxide, an oxide of nonstoichiometrically bonded B and O is also encompassed. However, since it is difficult to analyze nonstoichiometric boron oxide itself, boron oxide is calculated on the assumption that all the identified B is of $B_2O_3$ in ICP analysis. Herein as well, boron oxide will be described as $B_2O_3$.

Co, Pt, and one or more selected from Mn and V are constituents of magnetic grains (tiny magnets) in the granular structure of a magnetic thin film to be formed by sputtering. Hereinafter, one or more selected from Mn and V are abbreviated to "X" in the present specification, and magnetic grains contained in a magnetic thin film of a magnetic recording medium formed by using the target of the first embodiment are also referred to as "CoPtX alloy grains."

Co is a ferromagnetic metal element and plays a central role in the formation of magnetic grains (tiny magnets) in the granular structure of a magnetic thin film. From a viewpoint of increasing the uniaxial magnetic anisotropy constant $K_u$ of CoPtX alloy grains (magnetic grains) in a magnetic thin film to be obtained by sputtering as well as maintaining the magnetism of the CoPtX alloy grains (magnetic grains) in the obtained magnetic thin film, the Co content ratio in the sputtering target according to the first embodiment is preferably set to 25 mol % or more and 98.5 mol % or less based on the total metal components.

By alloying with Co and X within a predetermined compositional range, Pt acts to reduce the magnetic moment of the resulting alloy and plays a role in adjusting the intensity of the magnetism of magnetic grains. From a viewpoint of increasing the uniaxial magnetic anisotropy constant $K_u$ of CoPtX alloy grains (magnetic grains) in a magnetic thin film to be obtained by sputtering as well as adjusting the magnetism of the CoPtX alloy grains (magnetic grains) in the obtained magnetic thin film, the Pt content ratio in the sputtering target according to the first embodiment is preferably set to 1 mol % or more and 30 mol % or less based on the total metal components.

Figure 11:
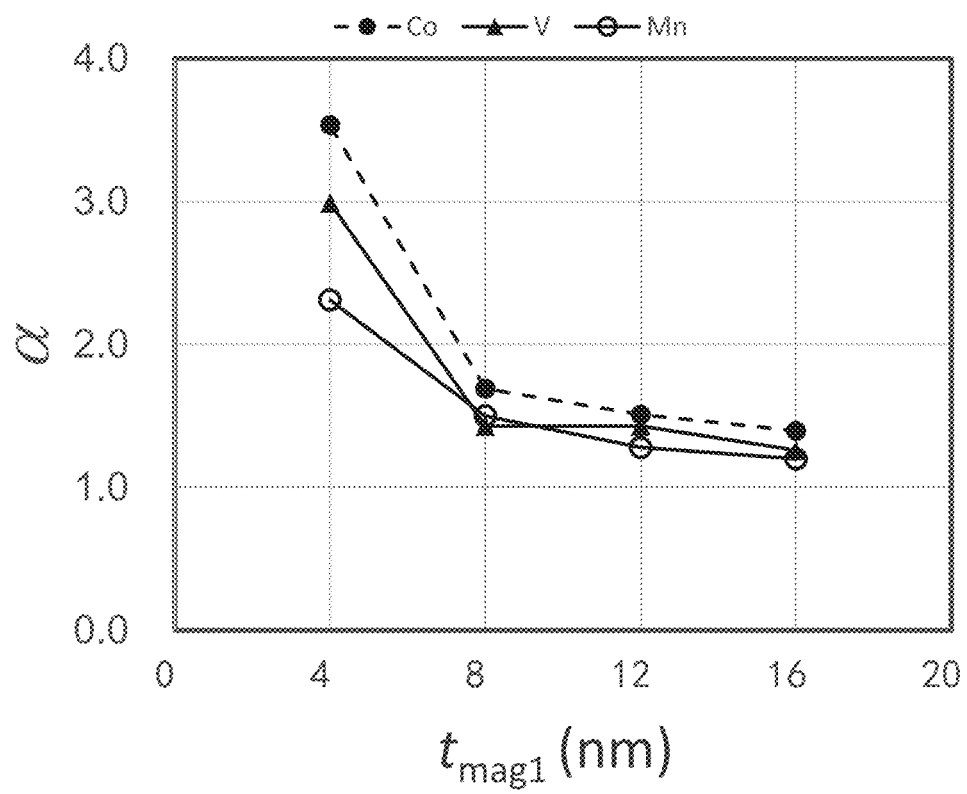
FIG. 11 is a graph showing a for the magnetic films of Examples 1 and 2 as well as Comparative Example 1.
Figure 12:
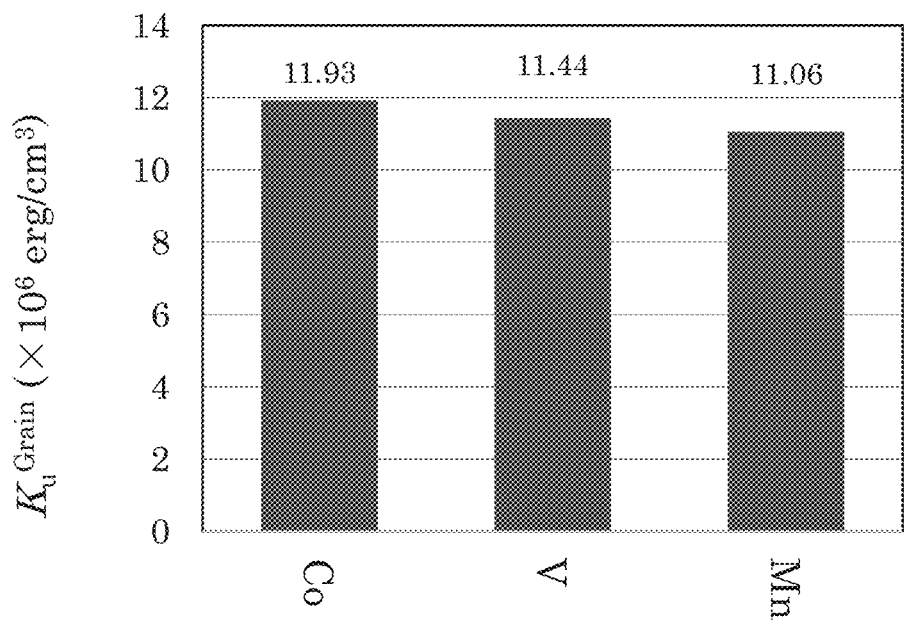
FIG. 12 is a graph showing measured results of $K_u^{Grain}$ for the magnetic films of Examples 1 and 2 as well as Comparative Example 1.

The present inventors found that V and Mn act to improve separation of CoPtX alloy grains (magnetic grains) by the oxide phase in a magnetic thin film and thus can reduce intergranular exchange coupling. Here, a magnetic thin film formed by sputtering using a CoPtX—$B_2O_3$ target (X=V or Mn) will be compared with a magnetic thin film formed by sputtering using a CoPt—$B_2O_3$ target. In the former, the $B_2O_3$ oxide phase exists deeper than the latter in the depth direction as partition walls between the neighboring CoPtX alloy grains (FIG. 7: TEM images) and the magnetization curve has a smaller slope a at the intersection with the horizontal axis (applied magnetic field) than the latter (FIG. 11). Consequently, improved separation of magnetic grains is confirmed. Meanwhile, the former has a uniaxial magnetic anisotropy constant $K_n^{Grain}$ per unit grain comparable to the latter (FIG. 12). Consequently, it is also confirmed that the magnetic thin film has satisfactory uniaxial magnetic anisotropy. The Examples described hereinafter reveal that V reduces α more and lowers $K_u$ less than Mn. Accordingly, V is considered to be more preferable.

The content ratio of X in the sputtering target according to the first embodiment is set to preferably 0.5 mol % or more and 10 mol % or less, more preferably 1 mol % or more and less than 10 mol %, and particularly preferably 5 mol % or less based on the total metal phase components. Mn and V may be contained each alone or in combination as the metal phase components of the sputtering target. In particular, using Mn and V in combination is preferable since it is possible to further reduce intergranular exchange coupling and to maintain uniaxial magnetic anisotropy.

The oxide phase constitutes a nonmagnetic matrix that partitions magnetic grains (tiny magnets) in the granular structure of a magnetic thin film. The oxide phase of the sputtering target according to the first embodiment contains at least B and O. As other oxides, an oxide of at least one element selected from V, Ru, Ti, Si, Ta, Cr, Al, Nb, Mn, Co, Ni, Zn, Y, Mo, W, La, Ce, Nd, Sm, Eu, Gd, Yb, Lu, and Zr may be contained. Concrete examples of other oxides include $VO_2$, $VO_3$, $V_2O_5$, $RuO_2$, $TiO_2$, $SiO_2$, $Ta_2O_5$, $Cr_2O_3$, $Al_2O_3$, $Nb_2O_5$, $MnO$, $Mn_3O_4$, $CoO$, $CoO_4$, $NiO$, $ZnO$, $Y_2O_3$, $MoO_2$, $WO_3$, $La_2O_3$, $CeO_2$, $Nd_2O_3$, $Sm_2O_3$, $Eu_2O_3$, $Gd_2O_3$, $Yb_2O_3$, $Lu_2O_3$, and $ZrO_2$.

$B_2O_3$, which is common boron oxide, has a low melting point of 450° C. and is thus slow to be deposited in the film forming process by sputtering. Accordingly, while CoPtX alloy grains grow into columnar grains, $B_2O_3$ in the liquid state exists between the columnar CoPtX alloy grains. For this reason, $B_2O_3$ is finally deposited as grain boundaries, which partition the CoPtX alloy grains that have grown into columnar grains, and constitutes a nonmagnetic matrix that partitions magnetic grains (tiny magnets) in the granular structure of a magnetic thin film. It is preferable to increase the oxide content in a magnetic thin film since magnetic grains are reliably and readily partitioned and isolated from each other. In this view, the oxide content in the sputtering target according to the first embodiment is preferably 25 vol % or more, more preferably 28 vol % or more, and further preferably 29 vol % or more. Meanwhile, when the oxide content in a magnetic thin film is excessively high, there is a risk that the oxide is mixed into CoPtX alloy grains (magnetic grains) and adversely affects the crystallinity of the CoPtX alloy grains (magnetic grains), thereby increasing the proportion of structures other than hcp in the CoPtX alloy grains (magnetic grains). Moreover, since the number of magnetic grains per unit area in the magnetic thin film decreases, it is difficult to increase the recording density. In view of the above, the content of the oxide phase in the sputtering target according to the first embodiment is preferably 40 vol % or less, more preferably 35 vol % or less, and further preferably 31 vol % or less.

In the sputtering target according to the first embodiment, the total content ratio of metal phase components and the total content ratio of oxide phase components based on the entire sputtering target are determined according to the intended component composition of a magnetic thin film and are thus not particularly limited. For example, the total content ratio of metal phase components may be set to 89.4 mol % or more and 96.4 mol % or less based on the entire sputtering target, and the total content ratio of oxide phase components may be set to 3.6 mol % or more and 11.6 mol % or less based on the entire sputtering target.

The microstructure of the sputtering target according to the first embodiment is not particularly limited but is preferably a microstructure in which the metal phase and the oxide phase are mutually and finely dispersed. Such a microstructure is less likely to cause trouble, such as nodules or particles, during sputtering.

The sputtering target according to the first embodiment can be produced as follows, for example.

A molten CoPt alloy is prepared from the metal components each weighed to satisfy a predetermined composition. The molten alloy was gas-atomized to yield CoPt alloy atomized powder. The prepared CoPt alloy atomized powder is classified into a predetermined particle size or less (106 μm or less, for example).

The prepared CoPt alloy atomized powder is added with one or more X metal powders selected from V and Mn, $B_2O_3$ powder, and other oxide powders as necessary (for example, $TiO_2$ powder, $SiO_2$ powder, $Ta_2O_5$ powder, $Cr_2O_3$ powder, $Al_2O_3$ powder, $ZrO_2$ powder, $Nb_2O_5$ powder, MnO powder, $Mn_3O_4$ powder, CoO powder, $Co_3O_4$ powder, NiO powder, ZnO powder, $Y_2O_3$ powder, $MoO_2$ powder, $WO_3$ powder, $La_2O_3$ powder, $CeO_2$ powder, $Nd_2O_3$ powder, $Sm_2O_3$ powder, $Eu_2O_3$ powder, $Gd_2O_3$ powder, $Yb_2O_3$ powder, and $Lu_2O_3$ powder) and mixed/dispersed in a ball mill to yield a mixed powder for pressure sintering. Through mixing/dispersing of the CoPt alloy atomized powder, X metal powders, $B_2O_3$ powder, and other oxide powders as necessary in a ball mill, it is possible to prepare a mixed powder for pressure sintering in which the CoPt alloy atomized powder, X metal powders, $B_2O_3$ powder, and other oxide powders used as necessary are mutually and finely dispersed.

From a viewpoint of reliably partitioning and readily isolating magnetic grains from each other by $B_2O_3$ and other oxides as necessary in a magnetic thin film formed using a sputtering target to be obtained, from a viewpoint of facilitating the formation of the hcp structure of CoPtX alloy grains (magnetic grains), and from a viewpoint of increasing the recording density, the total volume fraction of $B_2O_3$ powder and other oxide powders used as necessary is preferably 25 vol % or more and 40 vol % or less, more preferably 28 vol % or more and 35 vol % or less, and further preferably 29 vol % or more and 31 vol % or less based on the entire mixed powder for pressure sintering.

The prepared mixed powder for pressure sintering is formed to produce a sputtering target through pressure sintering by a vacuum hot press process, for example. Since the mixed powder for pressure sintering has been mixed/dispersed in a ball mill, the CoPt alloy atomized powder, X metal powders, $B_2O_3$ powder, and other oxide powders used as necessary are mutually and finely dispersed. For this reason, when sputtering is performed using a sputtering target obtained by the present production method, trouble, such as generation of particles or nodules, is less likely to arise. Here, the process by which the mixed powder for pressure sintering is pressure-sintered is not particularly limited, and a process other than a vacuum hot press process, such as a HIP process, may be employed.

To prepare a mixed powder for pressure sintering, each metal element powder may be used without being limited to the atomized powder. In this case, a mixed powder for pressure sintering can be prepared by mixing/dispersing each metal element powder, $B_2O_3$ powder, and other oxide powders as necessary in a ball mill.

Further, other oxides may be formed through oxidation of at least part of Co, V, and Mn, which are raw materials of the metal phase, during preparation of a mixed powder for pressure sintering or during sintering of the same.

(2) Second Embodiment

A sputtering target for a magnetic recording medium according to the second embodiment of the present invention is characterized by comprising: a metal phase containing Pt, at least one or more selected from Mn and V, and at least one or more selected from Cr and Ru, with the balance being Co and incidental impurities; and an oxide phase containing at least B and O.

The target of the second embodiment preferably comprises the metal phase containing 1 mol % or more and 30 mol % or less of Pt, more than 0.5 mol % and 30 mol % or less of at least one or more selected from Cr and Ru, and 0.5 mol % or more and 10 mol % or less of at least one or more selected from Mn and V, with the balance being Co and incidental impurities; and preferably comprises, based on the sputtering target for a magnetic recording medium as a whole, 25 vol % or more and 40 vol % or less of the oxide phase containing at least B and O.

The oxide phase containing B and O indicates a phase containing boron oxide. Although $B_2O_3$ is common as boron oxide, an oxide of nonstoichiometrically bonded B and O is also encompassed. However, since it is difficult to analyze nonstoichiometric boron oxide itself, boron oxide is calculated on the assumption that all the identified B is of $B_2O_3$ in ICP analysis. Herein as well, boron oxide will be described as $B_2O_3$.

Co, Pt, one or more selected from Mn and V (hereinafter, also referred to as "X"), and one or more selected from Cr and Ru (hereinafter, also referred to as "M") are constituents of magnetic grains (tiny magnets) in the granular structure of a magnetic thin film to be formed by sputtering. Hereinafter, magnetic grains of the second embodiment are also referred to as "CoPtXM alloy grains" in the present specification.

Co is a ferromagnetic metal element and plays a central role in the formation of magnetic grains (tiny magnets) in the granular structure of a magnetic thin film. From a viewpoint of increasing the uniaxial magnetic anisotropy constant $K_u$ of CoPtXM alloy grains (magnetic grains) in a magnetic thin film to be obtained by sputtering as well as maintaining the magnetism of the CoPtXM alloy grains (magnetic grains) in the obtained magnetic thin film, the Co content ratio in the sputtering target according to the second embodiment is preferably set to 25 mol % or more and 98 mol % or less based on the total metal components.

By alloying with Co, X, and M within a predetermined compositional range, Pt acts to reduce the magnetic moment of the resulting alloy and plays a role in adjusting the intensity of the magnetism of magnetic grains. From a viewpoint of increasing the uniaxial magnetic anisotropy constant $K_u$ of CoPtXM alloy grains (magnetic grains) in a magnetic thin film to be obtained by sputtering as well as adjusting the magnetism of the CoPtXM alloy grains (magnetic grains) in the obtained magnetic thin film, the Pt content ratio in the sputtering target according to the second embodiment is preferably set to 1 mol % or more and 30 mol % or less based on the total metal phase components.

At least one or more selected from Cr and Ru act, by alloying with Co within a predetermined compositional range, to reduce the magnetic moment of Co and play a role in adjusting the intensity of the magnetism of magnetic grains. From a viewpoint of increasing the uniaxial magnetic anisotropy constant $K_u$ of CoPtXM alloy grains (magnetic grains) in a magnetic thin film to be obtained by sputtering as well as maintaining the magnetism of the CoPtXM alloy grains in the obtained magnetic thin film, the content ratio of at least one or more selected from Cr and Ru in the sputtering target according to the second embodiment is preferably set to more than 0.5 mol % and 30 mol % or less based on the total metal phase components. Cr and Ru may be used each alone or in combination and form, together with Co and Pt, the metal phase of a sputtering target. The Examples described hereinafter reveal that Ru can reduce lowering in $K_u$ compared with Cr. Accordingly, Ru is considered to be more preferable.

The present inventors found that V and Mn act to improve separation of CoPtXM alloy grains (magnetic grains) by the oxide phase in a magnetic thin film and thus can reduce intergranular exchange coupling. Meanwhile, neither V nor Mn lowers the uniaxial magnetic anisotropy constant $K_u$ considerably. Since the Examples described hereinafter reveal that V reduces $\alpha$ more and lowers $K_u$ less than Mn, V is considered to be more preferable.

The content ratio of X in the sputtering target according to the second embodiment is set to preferably 0.5 mol % or more and 10 mol % or less, more preferably 1 mol % or more and less than 10 mol %, and particularly preferably 5 mol % or less based on the total metal phase components. Mn and V may be contained each alone or in combination as the metal phase components of the sputtering target. In particular, using V and Mn in combination is preferable since it is possible to reduce intergranular exchange coupling and to enhance uniaxial magnetic anisotropy.

The oxide phase constitutes a nonmagnetic matrix that partitions magnetic grains (tiny magnets) in the granular structure of a magnetic thin film. The oxide phase of the sputtering target according to the second embodiment contains at least B and O. As other oxide components, an oxide of at least one element selected from V, Ru, Ti, Si, Ta, Cr, Al, Nb, Mn, Co, Ni, Zn, Y, Mo, W, La, Ce, Nd, Sm, Eu, Gd, Yb, Lu, and Zr may be contained. Concrete examples of other oxides include $VO_2$, $VO_3$, $V_2O_5$, $RuO_2$, $TiO_2$, $SiO_2$, $Ta_2O_5$, $Cr_2O_3$, $Al_2O_3$, $Nb_2O_5$, $MnO$, $MnO_4$, $CoO$, $Co_3O_4$, $NiO$, $ZnO$, $Y_2O_3$, $MoO_2$, $WO_3$, $La_2O_3$, $CeO_2$, $Nd_2O_3$, $Sm_2O_3$, $Eu_2O_3$, $Gd_2O_3$, $Yb_2O_3$, $Lu_2O_3$, and $ZrO_2$.

$B_2O_3$, which has one common boron oxide, has a low melting point of 450° C. and is thus slow to be deposited in the film forming process by sputtering. Accordingly, while CoPtXM alloy grains grow into columnar grains, $B_2O_3$ in the liquid state exists between the columnar CoPtXM alloy grains. For this reason, $B_2O_3$ is finally deposited as grain boundaries, which partition the CoPtXM alloy grains that have grown into columnar grains, and constitutes a nonmagnetic matrix that partitions magnetic grains (tiny magnets) in the granular structure of a magnetic thin film. It is preferable to increase the oxide content in a magnetic thin film since magnetic grains are reliably and readily partitioned and isolated from each other. In this view, the oxide content in the sputtering target according to the second embodiment is preferably 25 vol % or more, more preferably 28 vol % or more, and further preferably 29 vol % or more. Meanwhile, when the oxide content in a magnetic thin film is excessively high, there is a risk that the oxide is mixed into CoPtXM alloy grains (magnetic grains) and adversely affects the crystallinity of the CoPtXM alloy grains (magnetic grains), thereby increasing the proportion of structures other than hcp in the CoPtXM alloy grains (magnetic grains). Moreover, since the number of magnetic grains per unit area in the magnetic thin film decreases, it is difficult to increase the recording density.

In view of the above, the content of the oxide phase in the sputtering target according to the second embodiment is preferably 40 vol % or less, more preferably 35 vol % or less, and further preferably 31 vol % or less.

In the sputtering target according to the second embodiment, the total content ratio of metal phase components and the total content ratio of oxide phase components based on the entire sputtering target are determined according to the intended component composition of a magnetic thin film and thus are not particularly limited. For example, the total content ratio of metal phase components may be set to 88.2 mol % or more and 96.4 mol % or less based on the entire sputtering target, and the total content ratio of oxide phase components may be set to 3.6 mol % or more and 11.8 mol % or less based on the entire sputtering target.

The microstructure of the sputtering target according to the second embodiment is not particularly limited but is preferably a microstructure in which the metal phase and the oxide phase are mutually and finely dispersed. Such a microstructure is less likely to cause trouble, such as nodules or particles, during sputtering.

The sputtering target according to the second embodiment can be produced as follows, for example.

A molten CoPtM alloy is prepared from Co, Pt. and one or more M metal powders selected from Cr and Ru each weighed to satisfy a predetermined composition. The molten alloy was gas-atomized to yield CoPtM alloy atomized powder. The prepared CoPtM alloy atomized powder is classified into a predetermined particle size or less (106 μm or less, for example).

The prepared CoPtM alloy atomized powder is added with one or more X metal powders selected from V and Mn, $B_2O_3$ powder, and other oxide powders as necessary (for example, $TiO_2$ powder, $SiO_2$ powder, $Ta_2O_5$ powder, $Cr_2O_3$ powder, $Al_2O_3$ powder, $ZrO_2$ powder, $Nb_2O_5$ powder, MnO powder, $Mn_3O_4$ powder, CoO powder, $Co_3O_4$ powder, NiO powder, ZnO powder, $Y_2O_3$ powder, $MoO_2$ powder, $WO_3$ powder, $La_2O_3$ powder, $CeO_2$ powder, $Nd_2O_3$ powder, $Sm_2O_3$ powder, $Eu_2O_3$ powder, $Gd_2O_3$ powder, $Yb_2O_3$ powder, and $Lu_2O_3$ powder) and mixed/dispersed in a ball mill to yield a mixed powder for pressure sintering. Through mixing/dispersing of the CoPtM alloy atomized powder, X metal powders, $B_2O_3$ powder, and other oxide powders as necessary in a ball mill, it is possible to prepare a mixed powder for pressure sintering in which the CoPtM alloy atomized powder, X metal powders, $B_2O_3$ powder, and other oxide powders used as necessary are mutually and finely dispersed.

From a viewpoint of reliably partitioning and readily isolating magnetic grains from each other by $B_2O_3$ and other oxides as necessary in a magnetic thin film formed using a sputtering target to be obtained, from a viewpoint of facilitating the formation of the hcp structure of CoPtXM alloy grains (magnetic grains), and from a viewpoint of increasing the recording density, the total volume fraction of $B_2O_3$ powder and other oxide powders used as necessary is preferably 25 vol % or more and 40 vol % or less, more preferably 28 vol % or more and 35 vol % or less, and further preferably 29 vol % or more and 31 vol % or less based on the entire mixed powder for pressure sintering.

The prepared mixed powder for pressure sintering is formed to produce a sputtering target through pressure sintering by a vacuum hot press process, for example. Since the mixed powder for pressure sintering has been mixed/dispersed in a ball mill, the CoPtM alloy atomized powder, X metal powders, $B_2O_3$ powder, and other oxide powders used as necessary are mutually and finely dispersed. For this reason, when sputtering is performed using a sputtering target obtained by the present production method, trouble, such as generation of particles or nodules, is less likely to arise. Here, the process by which the mixed powder for pressure sintering is pressure-sintered is not particularly limited, and a process other than a vacuum hot press process, such as a HIP process, may be employed.

To prepare a mixed powder for pressure sintering, each metal element powder may be used without being limited to the atomized powder. In this case, a mixed powder for pressure sintering can be prepared by mixing/dispersing each metal element powder, B powder as necessary, $B_2O_3$ powder, and other oxide powders as necessary in a ball mill.

Further, other oxides may be formed through oxidation of at least part of Co, Cr, Ru, V, and Mn, which are raw materials of the metal phase, during preparation of a mixed powder for pressure sintering or during sintering of the same.

(3) Third Embodiment

A sputtering target for a magnetic recording medium according to the third embodiment of the present invention is characterized by comprising: a metal phase containing Pt and at least one or more selected from Mn and V, with the balance being Co and incidental impurities; and an oxide phase.

The target of the third embodiment preferably comprises the metal phase containing 1 mol % or more and 30 mol % or less of Pt and 0.5 mol % or more and 10 mol % or less of at least one or more selected from Mn and V, with the balance being Co and incidental impurities; and preferably comprises, based on the sputtering target for a magnetic recording medium as a whole, 25 vol % or more and 40 vol % or less of the oxide phase.

The third embodiment is the same as the first embodiment except that the oxide phase is not limited to those containing boron oxide. For this reason, the explanations thereof will be omitted. Rather, the reason why the oxide phase is not limited to those containing boron oxide will be explained.

As is clear from the working examples described hereinafter, it is revealed that a sputtering target containing V or Mn in the metal phase even without containing boron oxide as an oxide reduces lowering in $K_u$ and reduces α. It is particularly preferable to include $SiO_2$ or $TiO_2$ as an oxide, since not only is α reduced but also $K_u$ is increased. Reduced α and reduced lowering in $K_u$ have been confirmed when $SiO_2$, $TiO_2$, $Cr_2O_3$, $Nb_2O_5$, $Ta_2O_5$, $MoO_3$, $WO_3$, CoO, $B_2O_3$, or appropriate combinations thereof are used as an oxide. These oxides are deposited as grain boundaries, which partition CoPtX alloy grains that have grown into columnar grains, and constitute a nonmagnetic matrix that partitions magnetic grains (tiny magnets) in the granular structure of a magnetic thin film.

In addition to the above-mentioned oxides, a sputtering target for a magnetic recording medium according to the third embodiment may further contain an oxide of at least one element selected from V. Ru, Al, Mn, Co, Ni, Zn, Y. Mo. La, Ce, Nd, Sm, Eu. Gd, Yb, Lu, and Zr. Concrete examples of other oxides include $VO_2$, $VO_3$, $V_2O_5$, $RuO_2$, $Al_2O_3$, MnO, $Mn_3O_4$, $Co_3O_4$, NiO, ZnO, $Y_2O_3$, $MoO_2$. $La_2O_3$, $CeO_2$. $Nd_2O_3$, $Sm_2O_3$, $Eu_2O_3$, $Gd_2O_3$. $Yb_2O_3$, $Lu_2O_3$, and $ZrO_2$.

(4) Fourth Embodiment

A sputtering target for a magnetic recording medium according to the fourth embodiment of the present invention is characterized by comprising: a metal phase containing Pt, at least one or more selected from Mn and V, and at least one or more selected from Cr and Ru, with the balance being Co and incidental impurities; and an oxide phase.

The target of the fourth embodiment preferably comprises the metal phase containing 1 mol % or more and 30 mol % or less of Pt, more than 0.5 mol % and 30 mol % or less of at least one or more selected from Cr and Ru, and 0.5 mol % or more and 10 mol % or less of at least one or more selected from Mn and V, with the balance being Co and incidental impurities, and preferably comprises, based on the sputtering target for a magnetic recording medium as a whole, 25 vol % or more and 40 vol % or less of the oxide.

The fourth embodiment is the same as the second embodiment except that the oxide phase is not limited to those containing boron oxide and is also the same as the third embodiment in that any oxide may be contained. For this reason, the explanations thereof will be omitted.

EXAMPLES

Hereinafter, the present invention will be described further by means of Examples and Comparative Examples.

Example 1

The composition of the entire target prepared as Example 1 is (75Co-20Pt-5V)-30 vol % $B_2O_3$ (atomic ratio for metal components), which is expressed by the molar ratio as 92.47(75Co-20Pt-5V)-7.53$B_2O_3$.

To produce the target according to Example 1, 50Co-50Pt alloy atomized powder and 100Co atomized powder were prepared first. Specifically, for the alloy atomized powder, each metal was weighed to satisfy the composition of 50 at % of Co and 50 at % of Pt. Both 50Co-50Pt alloy atomized powder and 100Co atomized powder were prepared by heating metal(s) to 1,500° C. or higher to form a molten alloy or a molten metal, followed by gas atomization.

The prepared 50Co-50Pt alloy atomized powder and 100Co atomized powder were classified through a 150 mesh sieve to obtain 50Co-50Pt alloy atomized powder and 100Co atomized powder each having a particle size of 106 µm or less.

To satisfy the composition of (75Co-20Pt-5V)-30 vol % $B_2O_3$, V powder and $B_2O_3$ powder were added to the classified 50Co-50Pt alloy atomized powder and 100Co atomized powder and mixed/dispersed in a ball mill to yield a mixed powder for pressure sintering.

Figure 2:
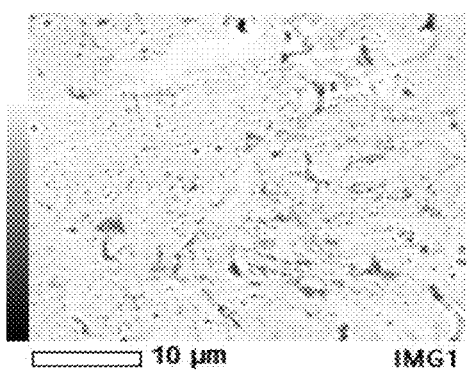
FIG. 2 is EDS maps for the bottom micrograph (×3,000) in FIG. 1.
Figure 2:
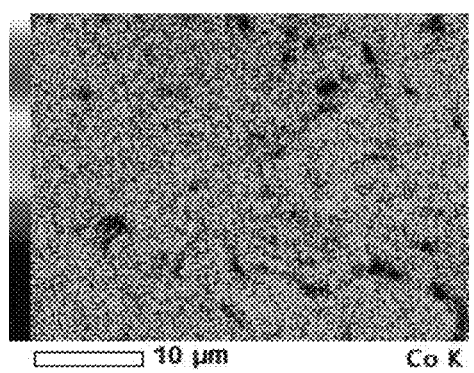
Figure 2:
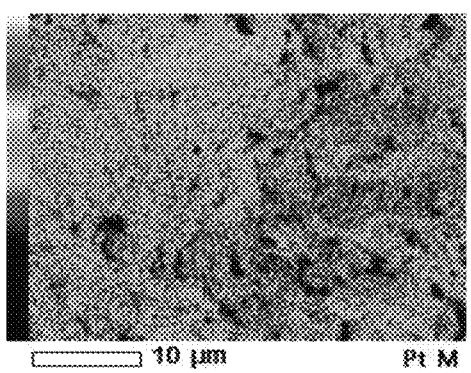
Figure 2:
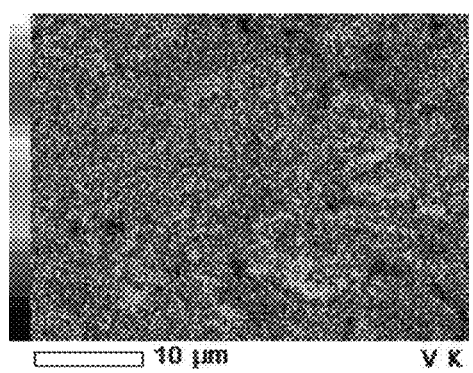
Figure 2:
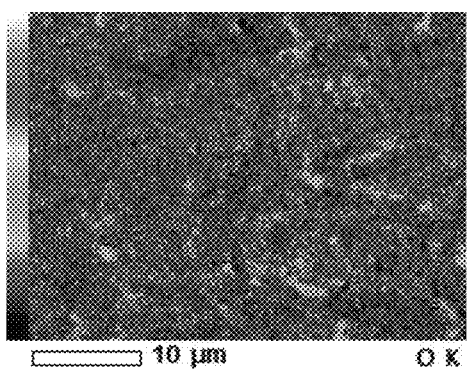
Figure 2:
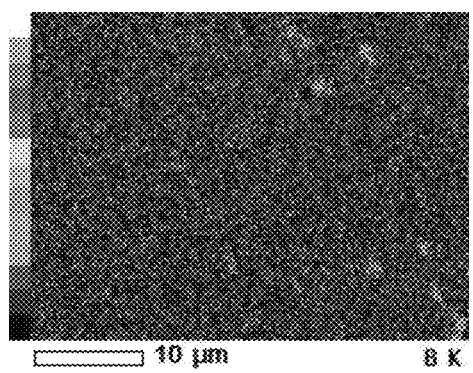

The obtained mixed powder for pressure sintering was hot-pressed at a sintering temperature of 810° C. and a sintering pressure of 24.5 MPa for a sintering time of 30 minutes in an atmosphere under vacuum conditions of $5 \times 10^{-2}$ Pa or less to yield a sintered test piece (ø30 mm). The prepared sintered test piece had a relative density of 98.8%, where the calculated density is 8.90 g/cm³. The cross-section in the thickness direction of the obtained sintered test piece was mirror-polished and observed under a scanning electron microscope (SEM: JCM-6000Plus from JEOL Ltd.) at an accelerating voltage of 15 keV. The results are shown in FIG. 1. Moreover, compositional analysis of the cross-sectional structure was performed by an energy dispersive X-ray spectrometer (EDS) attached to the SEM. The results are shown in FIG. 2. From these results, the metal phase (75Co-20Pt-5V alloy phase) and the oxide phase ($B_2O_3$) were confirmed to be finely dispersed. The ICP analysis results of the obtained sintered test piece are shown in Table 3.

Next, the prepared mixed powder for pressure sintering was hot-pressed at a sintering temperature of 810° C. and a sintering pressure of 24.5 MPa for a sintering time of 60 minutes in an atmosphere under vacuum conditions of $5\times10^{-2}$ Pa or less to produce a target (ø153.0×1.0 mm+ø161.0×4.0 mm). The produced target had a relative density of 98.3%.

Sputtering was performed using the prepared target in a DC sputtering apparatus (ES-3100W from Eiko Engineering, Ltd.) to form a magnetic thin film of (75Co-20Pt-5V)-30 vol % $B_2O_3$ on a glass substrate, thereby preparing a sample for magnetic characteristics measurement and a sample for structure observation. Specifically, as a layer for ensuring adhesion between the glass substrate and a metal film, Ta was deposited as a 5 nm-thick film under conditions of an Ar gas pressure of 0.6 Pa and input power of 500 W. Next, as a seed layer for forming an alignment film, $Ni_{90}W_{10}$ was deposited as a 6 nm-thick film at 0.6 Pa and 500 W. Subsequently, as an underlayer for the hcp structure, Ru was deposited as a 10 nm-thick film at 0.6 Pa and 500 W. To form a surface concavo-convex shape, Ru was then further deposited as a 10 nm-thick film at 8.0 Pa and 500 W. Further, for the purpose of improving separation of magnetic columns, Co-25Cr-50Ru-30 vol % $TiO_2$ was deposited as a 1 nm-thick film at 0.6 Pa and 300 W. Thereon, as a magnetic layer, (Co-20Pt-5V)-30 vol % $B_2O_3$ was deposited as 4 nm-, 8 nm-, 12 nm-, or 16 nm-thick film at 4.0 Pa and 500 W. Finally, as a surface protective layer, C was deposited as a 7 nm-thick film at 0.6 Pa and 300 W. These samples have a layered structure of Ta (5 nm, 0.6 Pa)/$Ni_{90}W_{10}$ (6 nm, 0.6 Pa)/Ru (10 nm, 0.6 Pa)/Ru (10 nm, 8.0 Pa)/Co-25Cr-50Ru-30 vol % $TiO_2$ (1 nm, 4.0 Pa)/(Co-20Pt-5V)-30 vol % $B_2O_3$ (Y nm (Y=4, 8, 12, or 16), 4 Pa)/C (7 nm, 0.6 Pa) in this order from the side closer to the glass substrate. The numbers in the left side within the parentheses represent the thickness, and the numbers in the right side represent the pressure of Ar atmosphere during sputtering. The magnetic thin film formed by using the target prepared in Example 1 is of CoPtV alloy-oxide ($B_2O_3$) and is a magnetic thin film that constitutes a recording layer of a perpendicular magnetic recording medium. Here, the magnetic thin film was formed at room temperature without elevating the temperature of the substrate.

To measure the magnetic characteristics of the obtained sample for magnetic characteristics measurement, a vibrating sample magnetometer (VSM: TM-VSM211483-HGC from Tamakawa Co., Ltd.), a torque magnetometer (TM-TR2050-HGC from Tamakawa Co., Ltd.), and a polar Kerr effect measurement apparatus (MOKE: BH-810CPM-CPC from Neoark Corporation) were used.

Figure 3:
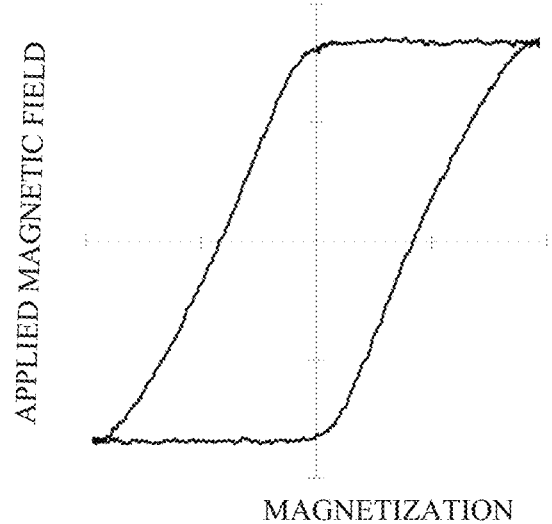
FIG. 3 is a magnetization curve for a granular medium of Example 1.

FIG. 3 shows an exemplary magnetization curve for a granular medium of the sample for magnetic characteristics measurement in Example 1 (Y=12 nm). In FIG. 3, the horizontal axis represents the intensity of applied magnetic field and the vertical axis represents the intensity of magnetization per unit volume.

From the measured results of the magnetization curve for the granular medium of the sample for magnetic characteristics measurement, the saturation magnetization ($M_S$), coercivity ($H_c$), nucleation field ($H_n$), and slope ($\alpha$) at intersection with horizontal axis were obtained. Moreover, the uniaxial magnetic anisotropy constant ($K_u$) was measured using the torque magnetometer. These values, together with the results for another Example and a Comparative Example, are shown in Table 1 and FIGS. 8 to 12.

Figure 6:
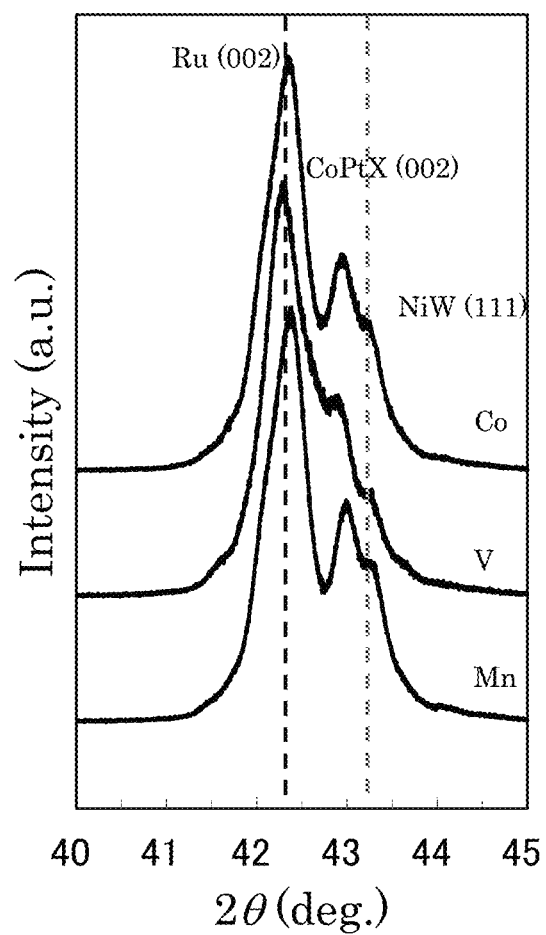
FIG. 6 is XRD profiles in the direction perpendicular to the film surfaces of magnetic films of Examples 1 and 2 as well as Comparative Example 1.
Figure 7:
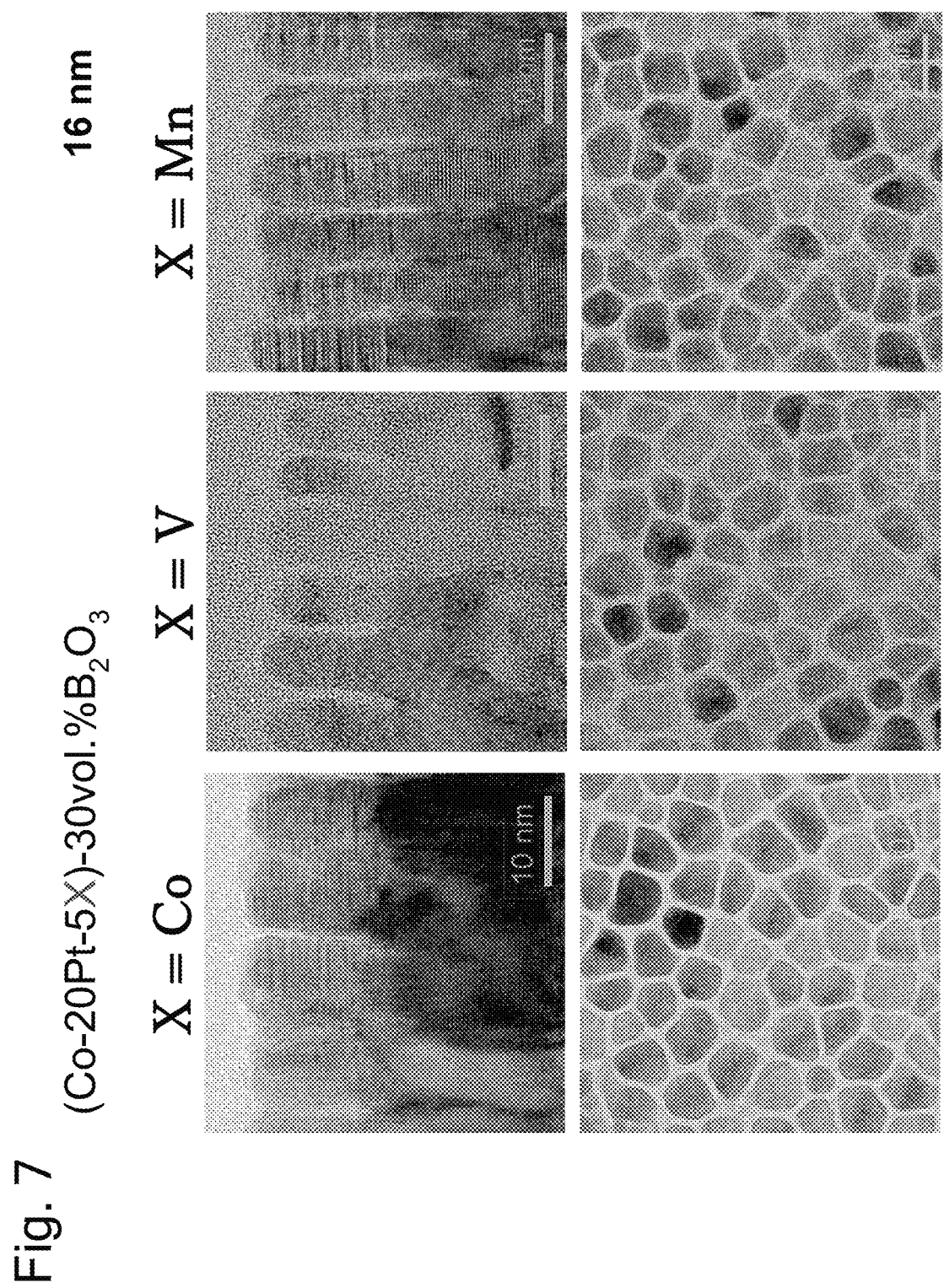
FIG. 7 is TEM images for the magnetic films (thickness of 16 nm) of Examples 1 and 2 as well as Comparative Example 1.

Further, for assessing the structure (assessing particle size and so forth of magnetic grains) of the obtained sample for structure observation, an X-ray diffractometer (XRD: Smart-Lab from Rigaku Corporation) and a transmission electron microscope (TEM: H-9500 from Hitachi High-Tech Corporation) were used. The XRD profile in the direction perpendicular to the film surface is shown in FIG. 6 and Table 2, and the TEM image is shown in FIG. 7.

Example 2

Figure 4:
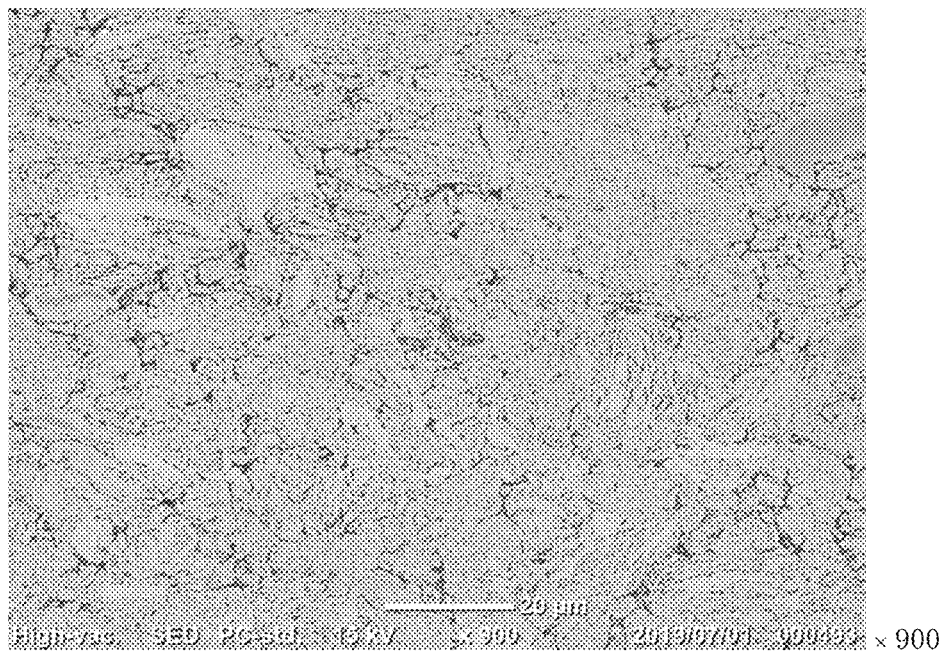
FIG. 4 is micrographs (top: ×900, bottom: ×3,000) by an SEM (accelerating voltage of 15 keV) for the cross-section in the thickness direction of a sintered test piece in Example
Figure 4:
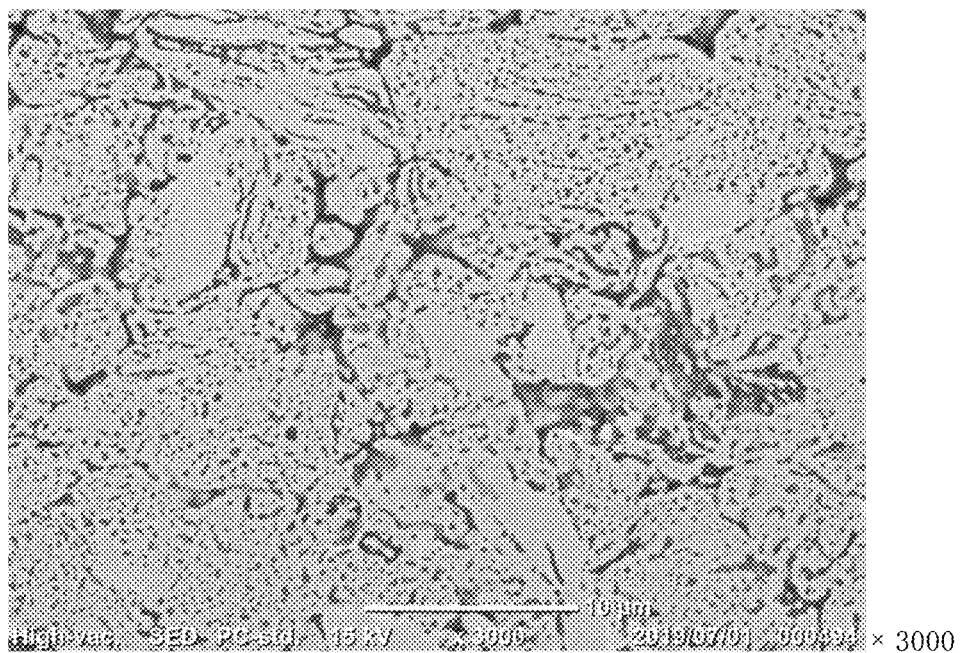
Figure 5:
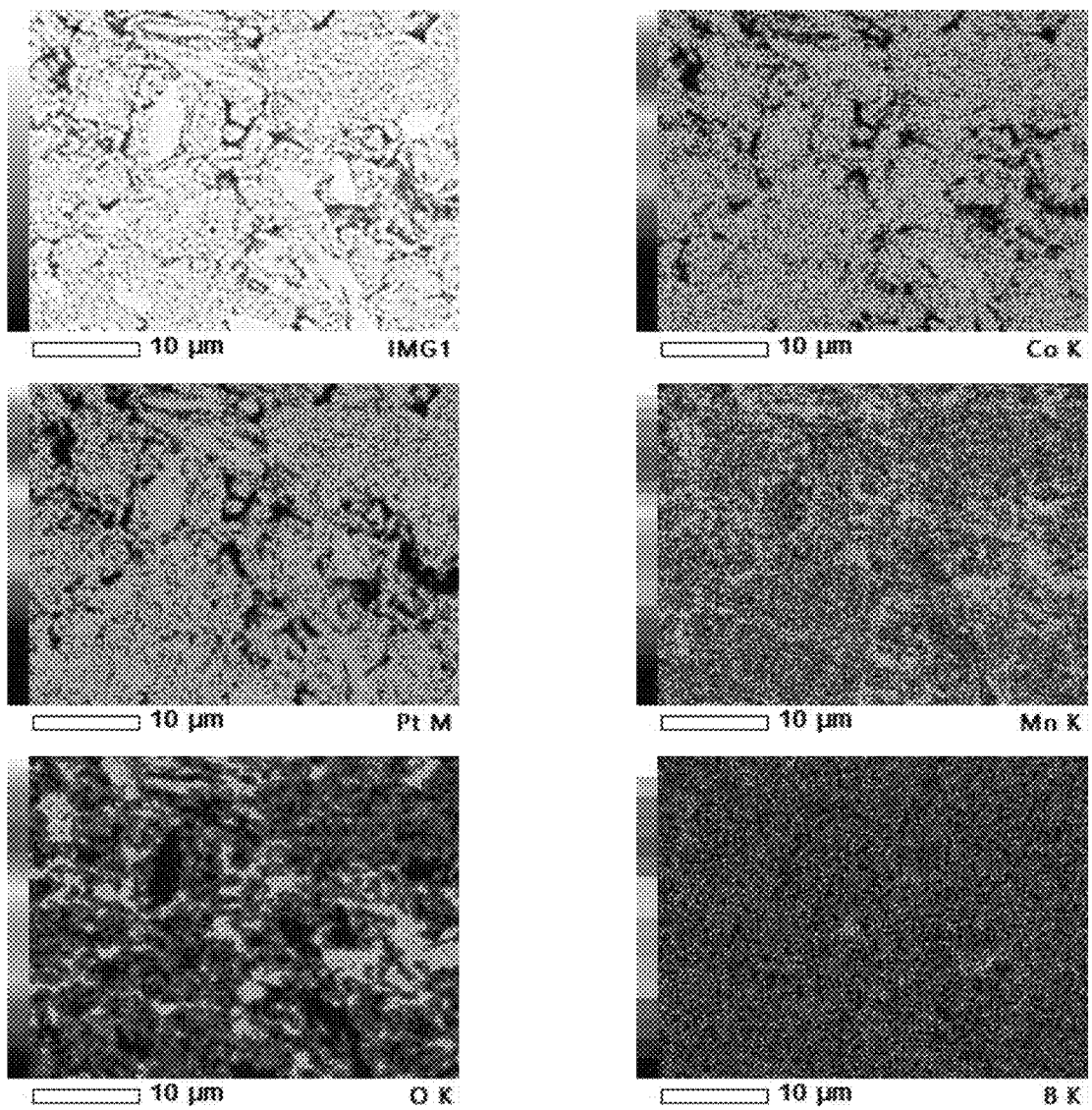
FIG. 5 is EDS maps for the bottom micrograph (×3,000) in FIG. 4.

The composition of the entire target prepared as Example 2 is (75Co-20Pt-5Mn)-30 vol % $B_2O_3$ (atomic ratio for metal components), which is expressed by the molar ratio as 92.51(75Co-20Pt-5Mn)-7.49$B_2O_3$. A sample for magnetic characteristics measurement and a sample for structure observation were prepared and observed in the same manner as Example 1 except for changing the target composition from Example 1. The results are shown in FIGS. 4 and 5. The Mn powder used had an average particle size of 3 μm or less. A sintered test piece (ø30 mm) was prepared by hot pressing at a sintering temperature of 840° C. and a sintering pressure of 24.5 MPa for a sintering time of 30 minutes in an atmosphere under vacuum conditions of $5\times10^{-2}$ Pa or less. The prepared sintered test piece had a relative density of 102.6%, where the calculated density is 8.97 g/cm³. The cross-section in the thickness direction of the obtained sintered test piece was observed under a metallurgical microscope, and the metal phase (75Co-20Pt-5Mn alloy phase) and the oxide phase ($B_2O_3$) were confirmed to be finely dispersed. The ICP analysis results of the obtained sintered test piece are shown in Table 3.

Next, a prepared mixed powder for pressure sintering was hot-pressed at a sintering temperature of 840° C. and a sintering pressure of 24.5 MPa for a sintering time of 60 minutes in an atmosphere under vacuum conditions of $5\times10^{-2}$ Pa or less to produce a target (ø153.0×1.0 mm+ø161.0×4.0 mm). The produced target had a relative density of 104.8%.

Later, magnetic characteristics assessment and structure observation for a film were performed in the same manner as Example 1. The measured results of the magnetic characteristics, together with the target composition, are shown in Table 1 and FIGS. 8 to 12. Moreover, the XRD profile in the direction perpendicular to the film surface for structure observation is shown in FIG. 6 and Table 2, and the TEM image is shown in FIG. 7.

Comparative Example 1

By changing the entire target composition into (80Co-20Pt)-30 vol % $B_2O_3$ (atomic ratio for metal components), a sintered test piece and a target were prepared and a magnetic thin film was formed and assessed in a similar manner to Examples 1 and 2. The measured results of the magnetic characteristics, together with the target composition, are shown in Table 1 and FIGS. 8 to 12. The XRD profile in the direction perpendicular to the film surface for structure observation is shown in FIG. 6, and the CoPt(002) peak position (2θ) and c-axis lattice constant read from the XRD profile are shown in Table 2. The TEM image is shown in FIG. 7, and the ICP analysis results of the obtained sintered test piece are shown in Table 3.

The symbols in Table 1 mean the following.
$t_{Mag1}$: thickness for magnetic layer in layered film
$M_s^{Grain}$: saturation magnetization solely for magnetic grains of magnetic layer in layered film
$H_c$: coercivity measured by Kerr effect
$H_n$: nucleation field measured by Kerr effect α: slope at intersection with horizontal axis (applied magnetic field) of magnetization curve measured by Kerr effect $H_c$–$H_n$: difference between coercivity and nucleation field measured by Kerr effect $K_u^{Grain}$: uniaxial anisotropy constant solely for magnetic grains of magnetic layer in layered film.

TABLE 1

Measured Results of Magnetic Characteristics

| X | | $t_{Mag.1}$ (nm) | $M_s^{Grain}$ (emu/cm³) | $H_c$ (kOe) | $H_n$ (kOe) | α | $H_c - H_n$ (kOe) | $K_u^{Grain}$ (*10⁶ erg/cm³) |
|---|---|---|---|---|---|---|---|---|
| Comp. Ex. 1 | Co | 16 | 1216 | 10.62 | 2.96 | 1.40 | 7.66 | |
| | | 12 | 1247 | 9.49 | 2.22 | 1.51 | 7.27 | |
| | | 8 | 1221 | 6.74 | 0.39 | 1.69 | 6.35 | 11.93 |
| | | 4 | 1270 | 1.41 | −1.75 | 3.53 | 3.16 | |
| Ex. 1 | V | 16 | 1210 | 9.64 | 1.20 | 1.26 | 8.44 | |
| | | 12 | 1204 | 8.37 | 0.96 | 1.43 | 7.41 | |
| | | 8 | 1219 | 6.09 | −1.38 | 1.43 | 7.47 | 11.44 |
| | | 4 | 1294 | 0.80 | −3.01 | 2.99 | 3.81 | |
| Ex. 2 | Mn | 16 | 1207 | 9.36 | 0.49 | 1.20 | 8.87 | |
| | | 12 | 1220 | 8.30 | −0.09 | 1.28 | 8.39 | |
| | | 8 | 1203 | 5.47 | −1.60 | 1.50 | 7.07 | 11.06 |
| | | 4 | 1334 | 1.10 | −3.99 | 2.31 | 5.09 | |

TABLE 2

CoPt(002) Peak Position and C-axis Lattice Constant

| X | CoPt(002) peak position (°) | C-axis lattice constant (Å) |
|---|---|---|
| Mn | 42.93 | 4.208 |
| V | 42.90 | 4.205 |
| Co | 42.91 | 4.206 |

TABLE 3

ICP Analysis Results for Sintered Test Pieces

| | Measured values (weight ratio) | | | | |
|---|---|---|---|---|---|
| Composition | Co concentration | Pt concentration | V concentration | Mn concentration | B concentration |
| (Co-20Pt)-30 vol. % $B_2O_3$ | 52.03 | 41.97 | | | 1.89 |
| (Co-20Pt-5V)-30 vol. % $B_2O_3$ | 48.77 | 42.76 | 2.62 | | 1.80 |
| (Co-20Pt-5Mn)-30 vol. % $B_2O_3$ | 48.53 | 42.79 | | 2.77 | 1.86 |

| | Metal component ratio (at % ratio) | | | | $B_2O_3$ |
| Composition | Co | Pt | V | Mn | vol. % |
| (Co-20Pt)-30 vol. % $B_2O_3$ | 80.4 | 19.6 | 0.0 | 0.0 | 29.8 |
| (Co-20Pt-5V)-30 vol. % $B_2O_3$ | 75.4 | 20.0 | 4.7 | 0.0 | 28.5 |
| (Co-20Pt-5Mn)-30 vol. % $B_2O_3$ | 75.3 | 20.1 | 0.0 | 4.6 | 29.4 |

From FIG. 6 and Table 2, it is confirmed that the CoPt (002) peaks of Example 1 (V) and Example 2 (Mn) are shifted to lower angles relative to the peak of Comparative Example 1 (Co). Accordingly, at least part of V or Mn is considered to replace Co. However, the changes in c-axis lattice constant of the CoPt phase calculated from the peak positions are 0.1 Å or less. In addition, no structural change of the CoPt phase is observed. Meanwhile, no peak shift is observed for Ru and NiW.

In FIG. 7, it is observed that the gaps between the neighboring magnetic columns extend deeper in the depth direction in the magnetic thin film containing V or Mn than in the magnetic thin film (X=Co) containing neither V nor Mn. Accordingly, it is confirmed that the separation of magnetic grains is improved by using the target containing V or Mn.

Figure 8:
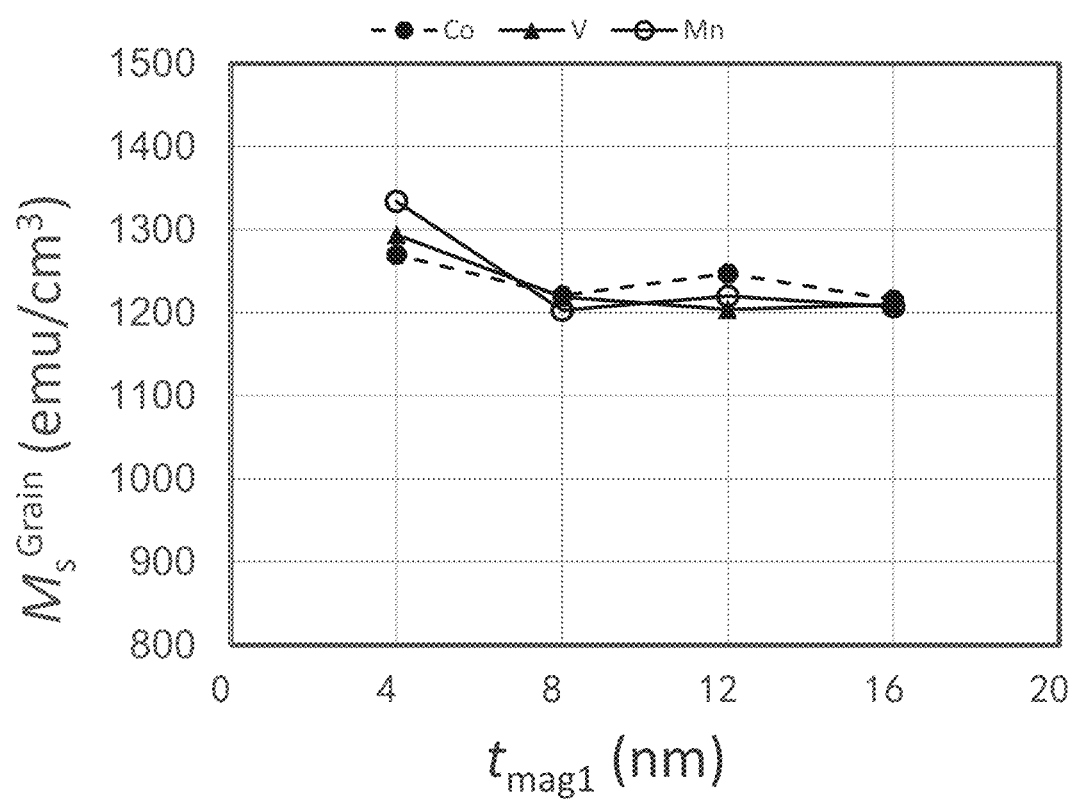
FIG. 8 is a graph showing measured results of $M_S$ for the magnetic films of Examples 1 and 2 as well as Comparative Example 1.

From FIG. 8, it is observed that Example 1 (V) and Example 2 (Mn) exhibit a slight increase in $M_s$ at a thickness of 4 nm but a nearly comparable $M_s$ at a thickness of 8 nm or more relative to Comparative Example 1 (Co). This reveals that the magnetism of CoPtX alloy grains (magnetic grains) can be maintained.

Figure 9:
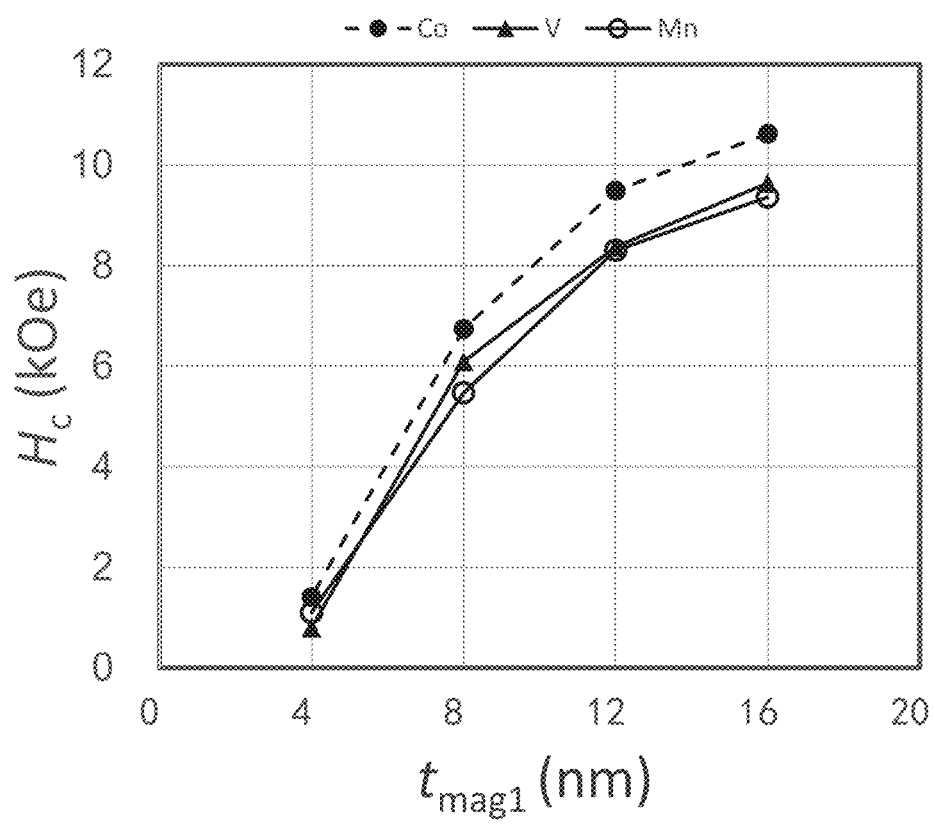
FIG. 9 is a graph showing measured results of $H_c$ for the magnetic films of Examples 1 and 2 as well as Comparative Example 1.

FIG. 9 reveals that the magnetic thin film containing V or Mn has $H_c$ comparable to or slightly lower than the magnetic thin film (X=Co) containing neither V nor Mn. However, a further improvement can be anticipated, for example, by optimizing the composition or by using V and Mn in combination.

Figure 10:
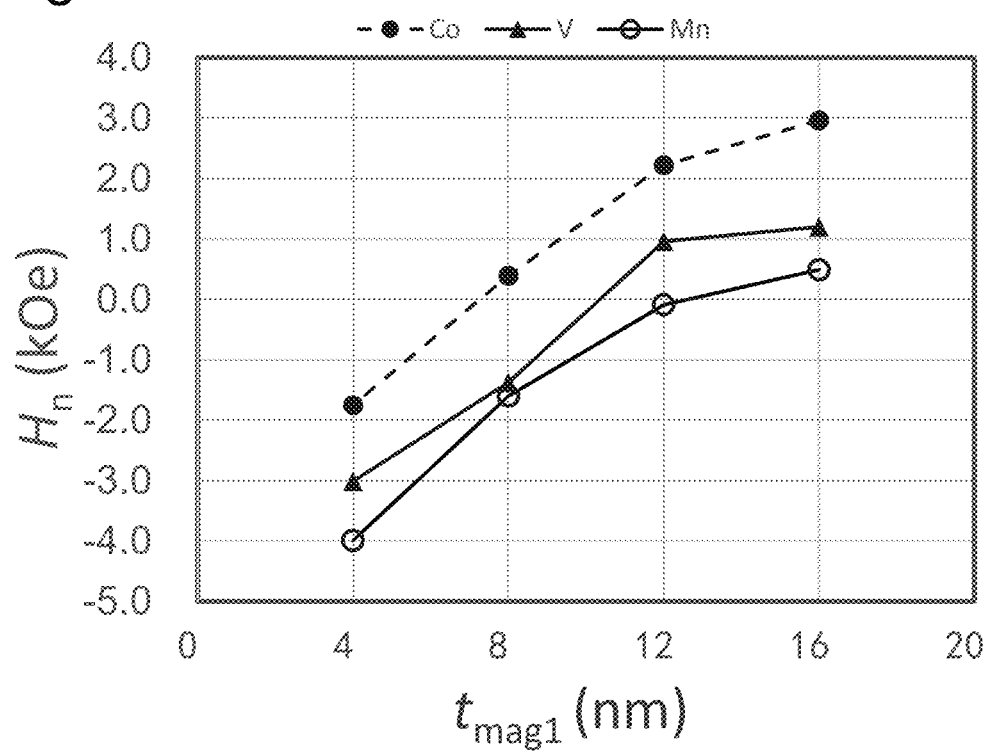
FIG. 10 is a graph showing measured results of $H_n$ for the magnetic films of Examples 1 and 2 as well as Comparative Example 1.

In FIG. 10, a lowering in $H_n$ is observed in Example 1 (V) relative to Comparative Example 1 (Co). In Example 2 (Mn), a further lowering in $H_n$ is observed relative to Example 1 (V). This suggests improved separation of magnetic grains.

FIG. 11 reveals that the magnetic thin film containing V or Mn exhibits a smaller than the magnetic thin film (X=Co) containing neither V nor Mn. Accordingly, improved separation of magnetic grains is confirmed.

FIG. 12 reveals that the magnetic thin film containing V or Mn exhibits $K_u$ comparable to the magnetic thin film (X=Co) containing neither V nor Mn. Accordingly, it is confirmed that high uniaxial magnetic anisotropy is maintained.

Examples 3 and 4, Comparative Example 2

Sputtering targets for a magnetic recording medium were prepared respectively in the same manner as Examples 1 and 2 as well as Comparative Example 1 except for changing the oxide phase into 30 vol % of $SiO_2$. Each 8 nm-thick magnetic layer is formed by using the prepared target, and the coercivity ($H_c$), nucleation field ($H_n$), slope at intersection with horizontal axis ($\alpha$), and uniaxial magnetic anisotropy constant ($K_u$) were measured in the same manner as Example 1. The results are shown in Table 4.

Examples 3 and 4, which contain V or Mn in the metal phase and $SiO_2$ as the oxide phase, reduce $\alpha$ and increase $K_u$ compared with Comparative Example 2 and are thus considered to exhibit improved separation of magnetic grains and high uniaxial magnetic anisotropy.

Examples 5 and 6, Comparative Example 3

Sputtering targets for a magnetic recording medium were prepared respectively in the same manner as Examples 1 and 2 as well as Comparative Example 1 except for changing the oxide phase into 30 vol % of $TiO_2$. Each 8 nm-thick magnetic layer is formed by using the prepared target, and the coercivity ($H_c$), nucleation field ($H_n$), slope at intersection with horizontal axis ($\alpha$), and uniaxial magnetic anisotropy constant ($K_u$) were measured in the same manner as Example 1. The results are shown in Table 4.

Examples 5 and 6, which contain V or Mn in the metal phase and $TiO_2$ as the oxide phase, reduce $\alpha$ and increase $K_u$ compared with Comparative Example 3 and are thus considered to exhibit improved separation of magnetic grains and high uniaxial magnetic anisotropy.

Examples 7 and 8, Comparative Example 4

Sputtering targets for a magnetic recording medium were prepared respectively in the same manner as Examples 1 and 2 as well as Comparative Example 1 except for changing the oxide phase into 30 vol % of $Cr_2O_3$. Each 8 nm-thick magnetic layer is formed by using the prepared target, and the coercivity ($H_c$), nucleation field ($H_n$), slope at intersection with horizontal axis ($\alpha$), and uniaxial magnetic anisotropy constant ($K_u$) were measured in the same manner as Example 1. The results are shown in Table 4.

Examples 7 and 8, which contain V or Mn in the metal phase and $Cr_2O_3$ as the oxide phase, reduce $\alpha$ and have lowering in $K_u$ as small as 0.95 or less compared with Comparative Example 4 and are thus considered to improve separation of magnetic grains and maintain high uniaxial magnetic anisotropy.

Examples 9 and 10, Comparative Example 5

Sputtering targets for a magnetic recording medium were prepared respectively in the same manner as Examples 1 and 2 as well as Comparative Example 1 except for changing the oxide phase into 30 vol % of $Nb_2O_5$. Each 8 nm-thick magnetic layer is formed by using the prepared target, and the coercivity ($H_c$), nucleation field ($H_n$), slope at intersection with horizontal axis ($\alpha$), and uniaxial magnetic anisotropy constant ($K_u$) were measured in the same manner as Example 1. The results are shown in Table 4.

Examples 9 and 10, which contain V or Mn in the metal phase and $Nb_2O_5$ as the oxide phase, reduce $\alpha$ and have lowering in $K_u$ as small as 0.39 or less compared with Comparative Example 5 and are thus considered to improve separation of magnetic grains and maintain high uniaxial magnetic anisotropy.

Examples 11 and 12, Comparative Example 6

Sputtering targets for a magnetic recording medium were prepared respectively in the same manner as Examples 1 and 2 as well as Comparative Example 1 except for changing the oxide phase into 30 vol % of $Ta_2O_5$. Each 8 nm-thick magnetic layer is formed by using the prepared target, and the coercivity ($H_c$), nucleation field ($H_n$), slope at intersection with horizontal axis ($\alpha$), and uniaxial magnetic anisotropy constant ($K_u$) were measured in the same manner as Example 1. The results are shown in Table 4.

Examples 11 and 12, which contain V or Mn in the metal phase and $Ta_2O_5$ as the oxide phase, have a smaller than Comparative Example 6 and lowering in $K_u$ as small as 0.47 or less and are thus considered to improve separation of magnetic grains and maintain high uniaxial magnetic anisotropy.

Examples 13 and 14, Comparative Example 7

Sputtering targets for a magnetic recording medium were prepared respectively in the same manner as Examples 1 and 2 as well as Comparative Example 1 except for changing the oxide phase into 30 vol % of $MoO_3$. Each 8 nm-thick magnetic layer is formed by using the prepared target, and the coercivity ($H_c$), nucleation field ($H_n$), slope at intersection with horizontal axis ($\alpha$), and uniaxial magnetic anisotropy constant ($K_u$) were measured in the same manner as Example 1. The results are shown in Table 5.

Examples 13 and 14, which contain V or Mn in the metal phase and $MoO_3$ as the oxide phase, reduce $\alpha$ and have lowering in $K_u$ as small as 0.30 or less compared with Comparative Example 7 and are thus considered to improve separation of magnetic grains and maintain high uniaxial magnetic anisotropy.

Examples 15 and 16, Comparative Example 8

Sputtering targets for a magnetic recording medium were prepared respectively in the same manner as Examples 1 and 2 as well as Comparative Example 1 except for changing the oxide phase into 30 vol % of $WO_3$. Each 8 nm-thick magnetic layer is formed by using the prepared target, and the coercivity ($H_c$), nucleation field ($H_n$), slope at intersection with horizontal axis ($\alpha$), and uniaxial magnetic anisotropy constant ($K_u$) were measured in the same manner as Example 1. The results are shown in Table 5.

Examples 15 and 16, which contain V or Mn in the metal phase and $WO_3$ as the oxide phase, reduce $\alpha$ and have lowering in $K_u$ as small as 0.51 or less compared with Comparative Example 8 and are thus considered to improve separation of magnetic grains and maintain high uniaxial magnetic anisotropy.

Examples 17 and 18, Comparative Example 9

Sputtering targets for a magnetic recording medium were prepared respectively in the same manner as Examples 1 and 2 as well as Comparative Example 1 except for changing the oxide phase into 15 vol % $B_2O_3$-15 vol % $SiO_2$. Each 8 nm-thick magnetic layer is formed by using the prepared target, and the coercivity ($H_c$), nucleation field ($H_n$), slope at intersection with horizontal axis (α), and uniaxial magnetic anisotropy constant ($K_u$) were measured in the same manner as Example 1. The results are shown in Table 5.

Examples 17 and 18, which contain V or Mn in the metal phase and $B_2O_3$ and $SiO_2$ as the oxide phase, reduce α and lowering in $K_u$ as small as 0.18 or less compared with Comparative Example 9 and are thus considered to improve separation of magnetic grains and maintain high uniaxial magnetic anisotropy.

Examples 19 and 20, Comparative Example 10

Sputtering targets for a magnetic recording medium were prepared respectively in the same manner as Examples 1 and 2 as well as Comparative Example 1 except for changing the oxide phase into 15 vol % $SiO_2$-15 vol % $TiO_2$. Each 8 nm-thick magnetic layer is formed by using the prepared target, and the coercivity ($H_c$), nucleation field ($H_n$), slope at intersection with horizontal axis (α), and uniaxial magnetic anisotropy constant ($K_u$) were measured in the same manner as Example 1. The results are shown in Table 5.

Examples 19 and 20, which contain V or Mn in the metal phase and $SiO_2$ and $TiO_2$ as the oxide phase, reduce α and an increase in $K_u$ or an extremely small lowering in $K_u$ of 0.01 compared with Comparative Example 10 and are thus considered to exhibit improved separation of magnetic grains and high uniaxial magnetic anisotropy.

Examples 21 and 22, Comparative Example 11

Sputtering targets for a magnetic recording medium were prepared respectively in the same manner as Examples 1 and 2 as well as Comparative Example 1 except for changing the oxide phase into 20 vol % $B_2O_3$-5 vol % $Cr_2O_3$. Each 8 nm-thick magnetic layer is formed by using the prepared target, and the coercivity ($H_c$), nucleation field ($H_n$), slope at intersection with horizontal axis (α), and uniaxial magnetic anisotropy constant ($K_u$) were measured in the same manner as Example 1. The results are shown in Table 5.

Examples 21 and 22, which contain V or Mn in the metal phase and $B_2O_3$ and $Cr_2O_3$ as the oxide phase, reduce α and have lowering in $K_u$ as small as 0.54 or less compared with Comparative Example 11 and are thus considered to improve separation of magnetic grains and maintain high uniaxial magnetic anisotropy.

Examples 23 and 24, Comparative Example 12

Sputtering targets for a magnetic recording medium were prepared respectively in the same manner as Examples 1 and 2 as well as Comparative Example 1 except for changing the oxide phase into 10 vol % $SiO_2$-10 vol % $TiO_2$-10 vol % CoO. Each 8 nm-thick magnetic layer is formed by using the prepared target, and the coercivity ($H_c$), nucleation field ($H_n$), slope at intersection with horizontal axis (α), and uniaxial magnetic anisotropy constant ($K_u$) were measured in the same manner as Example 1. The results are shown in Table 5.

Examples 23 and 24, which contain V or Mn in the metal phase and $SiO_2$, $TiO_2$, and CoO as the oxide phase, reduce α and have lowering in $K_u$ as small as 0.35 compared with Comparative Example 12 and are thus considered to exhibit improved separation of magnetic grains and high uniaxial magnetic anisotropy.

Examples 25 and 26, Comparative Example 13

Sputtering targets for a magnetic recording medium were prepared respectively in the same manner as Examples 1 and 2 as well as Comparative Example 1 except for changing the oxide phase into 20 vol % $SiO_2$-5 vol % $TiO_2$-5 vol % CoO. Each 8 nm-thick magnetic layer is formed by using the prepared target, and the coercivity ($H_c$), nucleation field ($H_n$), slope at intersection with horizontal axis (α), and uniaxial magnetic anisotropy constant ($K_u$) were measured in the same manner as Example 1. The results are shown in Table 6.

Examples 25 and 26, which contain V or Mn in the metal phase and $SiO_2$, $TiO_2$, and CoO as the oxide phase, reduce α and have lowering in $K_u$ as small as 1.02 compared with Comparative Example 13 and are thus considered to exhibit improved separation of magnetic grains and high uniaxial magnetic anisotropy.

Examples 27 and 28, Comparative Example 14

Sputtering targets for a magnetic recording medium were prepared respectively in the same manner as Examples 1 and 2 as well as Comparative Example 1 except for changing the oxide phase into 20 vol % $B_2O_3$-5 vol % $SiO_2$-5 vol % $Cr_2O_3$. Each 8 nm-thick magnetic layer is formed by using the prepared target, and the coercivity ($H_c$), nucleation field (H), slope at intersection with horizontal axis (α), and uniaxial magnetic anisotropy constant ($K_u$) were measured in the same manner as Example 1. The results are shown in Table 6.

Examples 27 and 28, which contain V or Mn in the metal phase and $SiO_2$, $TiO_2$, and CoO as the oxide phase, reduce α and have an increase in $K_u$ or an extremely small lowering in $K_u$ of 0.19 compared with Comparative Example 14 and are thus considered to exhibit improved separation of magnetic grains and high uniaxial magnetic anisotropy.

Examples 29 and 30, Comparative Example 15

Sputtering targets for a magnetic recording medium were prepared respectively in the same manner as Examples 1 and 2 as well as Comparative Example 1 except for changing the oxide phase into 20 vol % $B_2O_3$-3 vol % $SiO_2$-3 vol % $TiO_2$-10 vol % CoO. Each 8 nm-thick magnetic layer is formed by using the prepared target, and the coercivity ($H_c$), nucleation field ($H_n$), slope at intersection with horizontal axis (α), and uniaxial magnetic anisotropy constant ($K_u$) were measured in the same manner as Example 1. The results are shown in Table 6.

Examples 29 and 30, which contain V or Mn in the metal phase and $B_2O_3$, $SiO_2$, $TiO_2$, and CoO as the oxide phase, reduce α and have an increase in $K_u$ compared with Comparative Example 15 and are thus considered to exhibit improved separation of magnetic grains and high uniaxial magnetic anisotropy.

Example 31

A sputtering target for a magnetic recording medium was prepared in the same manner as Example 1 except for changing the metal phase composition into 79Co-20Pt-1V. An 8 nm-thick magnetic layer is formed by using the prepared target, and the coercivity ($H_c$), nucleation field ($H_n$), slope at intersection with horizontal axis (α), and uniaxial magnetic anisotropy constant ($K_u$) were measured in the same manner as Example 1. The results are shown in Table 6.

Example 31 containing 1 mol % of V in the metal phase exhibits a smaller reduction in α, but a smaller lowering in $K_u$ of 0.04 compared with Example 1, which contains 5 mol % of V.

Example 32

A sputtering target for a magnetic recording medium was prepared in the same manner as Example 2 except for changing the metal phase composition into 79Co-20Pt-1Mn. An 8 nm-thick magnetic layer is formed by using the prepared target, and the coercivity ($H_c$), nucleation field ($H_n$), slope at intersection with horizontal axis (α), and uniaxial magnetic anisotropy constant (K) were measured in the same manner as Example 1. The results are shown in Table 6.

Example 32 containing 1 mol % of Mn in the metal phase exhibits a smaller reduction in α, but a smaller lowering in $K_u$ compared with Example 2, which contains 5 mol % of Mn Example 33

A sputtering target for a magnetic recording medium was prepared in the same manner as Example 1 except for changing the metal phase composition into 70Co-20Pt-10V. An 8 nm-thick magnetic layer is formed by using the prepared target, and the coercivity ($H_c$), nucleation field ($H_n$), slope at intersection with horizontal axis (α), and uniaxial magnetic anisotropy constant ($K_u$) were measured in the same manner as Example 1. The results are shown in Table 6.

Example 33 containing 10 mol % of V in the metal phase exhibits an almost same reduction in α, but a larger lowering in $K_u$ compared with Example 1, which contains 5 mol % of V.

Example 34

A sputtering target for a magnetic recording medium was prepared in the same manner as Example 2 except for changing the metal phase composition into 70Co-20Pt-10Mn. An 8 nm-thick magnetic layer is formed by using the prepared target, and the coercivity ($H_c$), nucleation field ($H_n$), slope at intersection with horizontal axis (α), and uniaxial magnetic anisotropy constant ($K_u$) were measured in the same manner as Example 1. The results are shown in Table 6.

Example 34 containing 10 mol % of Mn in the metal phase exhibits an almost same reduction in α, but a larger lowering in $K_u$ compared with Example 2, which contains 5 mol % of Mn Comparative Example 16

A sputtering target for a magnetic recording medium was prepared in the same manner as Example 1 except for changing the metal phase composition into 65Co-20Pt-15V. An 8 nm-thick magnetic layer is formed by using the prepared target, and the coercivity ($H_c$), nucleation field ($H_n$), slope at intersection with horizontal axis (α), and uniaxial magnetic anisotropy constant ($K_u$) were measured in the same manner as Example 1. The results are shown in Table 6.

Comparative Example 16 containing 15 mol % of V exhibits lowering in $K_u$ considerably larger than Examples 1, 31, and 33, which contain 1 to 10 mol % of V.

Comparative Example 17

A sputtering target for a magnetic recording medium was prepared in the same manner as Example 2 except for changing the metal phase composition into 65Co-20Pt-15Mn. An 8 nm-thick magnetic layer is formed by using the prepared target, and the coercivity ($H_c$), nucleation field ($H_n$), slope at intersection with horizontal axis (α), and uniaxial magnetic anisotropy constant ($K_u$) were measured in the same manner as Example 1. The results are shown in Table 6.

Comparative Example 17 containing 15 mol % of Mn exhibits lowering in $K_u$ considerably larger than Examples 2, 32, and 34, which contain 1 to 10 mol % of Mn.

Examples 35 and 36, Comparative Example 18

In Example 35, a sputtering target for a magnetic recording medium was prepared in the same manner as Example 1 except for changing the metal phase composition into 75Co-20Pt-2Cr-3V. In Example 36, a sputtering target for a magnetic recording medium was prepared in the same manner as Example 2 except for changing the metal phase composition into 75Co-20Pt-2Cr-3Mn. In Comparative Example 18, a sputtering target for a magnetic recording medium was prepared in the same manner as Comparative Example 1 except for changing the metal phase composition into 75Co-20Pt-5Cr. Each 8 nm-thick magnetic layer is formed by using the prepared target, and the coercivity ($H_c$), nucleation field ($H_n$), slope at intersection with horizontal axis (α), and uniaxial magnetic anisotropy constant ($K_u$) were measured in the same manner as Example 1. The results are shown in Table 6.

Examples 35 and 36 further containing Cr in the metal phase composition exhibit lowering in $K_u$ smaller than Examples 1 and 2 and are thus considered to exhibit improved separation of magnetic grains and high uniaxial magnetic anisotropy.

Examples 37 and 38, Comparative Example 19

In Example 37, a sputtering target for a magnetic recording medium was prepared in the same manner as Example 1 except for changing the metal phase composition into 75Co-20Pt-2Ru-3V. In Example 38, a sputtering target for a magnetic recording medium was prepared in the same manner as Example 2 except for changing the metal phase composition into 75Co-20Pt-2Ru-3Mn. In Comparative Example 19, a sputtering target for a magnetic recording medium was prepared in the same manner as Comparative Example 1 except for changing the metal phase composition into 75Co-20Pt-5Ru. Each 8 nm-thick magnetic layer is formed by using the prepared target, and the coercivity ($H_c$), nucleation field ($H_n$), slope at intersection with horizontal axis (α), and uniaxial magnetic anisotropy constant ($K_u$) were measured in the same manner as Example 1. The results are shown in Table 6.

Examples 37 and 38 further containing Ru in the metal phase composition exhibit lowering in $K_u$ smaller than Examples 1 and 2 and are thus considered to exhibit improved separation of magnetic grains and high uniaxial magnetic anisotropy.

The results shown in Tables 4 to 6 reveal that reduction in α is larger and lowering in $K_u$ is smaller when the metal phase contains V than when the metal phase contains Mn. Accordingly, it is considered possible to improve separation of magnetic grains and to maintain high uniaxial magnetic anisotropy by including V or Mn and is also concluded that V is effective for further improvement in separation of magnetic grains and further maintenance of high uniaxial magnetic anisotropy. Moreover, it is considered possible to improve separation of magnetic grains and to maintain high uniaxial magnetic anisotropy even by any oxide and is concluded that including $SiO_2$ or $TiO_2$ is further effective. Further, it has been confirmed that uniaxial magnetic anisotropy ($K_u$) can be enhanced by including $B_2O_3$ and that α can be reduced while maintaining high uniaxial magnetic anisotropy ($K_u$) by including $SiO_2$ or $TiO_2$.

TABLE 4

Measured Results of Magnetic Characteristics (No. 1)

|  | Metal phase composition | Oxide phase composition | $H_c$ (kOe) | $H_n$ (kOe) | α | $H_c - H_n$ (kOe) | $K_u^{Grain}$ (×10⁶ erg/cm³) |
|---|---|---|---|---|---|---|---|
| Comp. Ex. 1 | 80Co-20Pt | 30 vol. % $B_2O_3$ | 6.74 | 0.39 | 1.69 | 6.35 | 11.93 |
| Ex. 1 | 75Co-20Pt-5V | 30 vol. % $B_2O_3$ | 6.09 | −1.38 | 1.43 | 7.47 | 11.44 |
| Ex. 2 | 75Co-20Pt-5Mn | 30 vol. % $B_2O_3$ | 5.47 | −1.60 | 1.50 | 7.07 | 11.06 |
| Comp. Ex. 2 | 80Co-20Pt | 30 vol. % $SiO_2$ | 3.30 | −1.98 | 1.80 | 5.28 | 7.77 |
| Ex. 3 | 75Co-20Pt-5V | 30 vol. % $SiO_2$ | 4.21 | −1.86 | 1.62 | 6.07 | 8.20 |
| Ex. 4 | 75Co-20Pt-5Mn | 30 vol. % $SiO_2$ | 3.81 | −2.12 | 1.64 | 5.93 | 7.92 |
| Comp. Ex. 3 | 80Co-20Pt | 30 vol. % $TiO_2$ | 2.40 | −3.35 | 1.46 | 5.75 | 6.53 |
| Ex. 5 | 75Co-20Pt-5V | 30 vol. % $TiO_2$ | 3.00 | −2.98 | 1.42 | 5.98 | 7.00 |
| Ex. 6 | 75Co-20Pt-5Mn | 30 vol. % $TiO_2$ | 2.83 | −3.12 | 1.43 | 5.95 | 6.84 |
| Comp. Ex. 4 | 80Co-20Pt | 30 vol. % $Cr_2O_3$ | 1.20 | −0.77 | 4.73 | 1.97 | 8.70 |
| Ex. 7 | 75Co-20Pt-5V | 30 vol. % $Cr_2O_3$ | 2.01 | −1.11 | 3.00 | 3.12 | 7.80 |
| Ex. 8 | 75Co-20Pt-5Mn | 30 vol. % $Cr_2O_3$ | 1.75 | −1.39 | 3.17 | 3.14 | 7.75 |
| Comp. Ex. 5 | 80Co-20Pt | 30 vol. % $Nb_2O_5$ | 4.14 | −1.26 | 2.14 | 5.40 | 11.41 |
| Ex. 9 | 75Co-20Pt-5V | 30 vol. % $Nb_2O_5$ | 4.02 | −1.97 | 1.97 | 5.99 | 11.22 |
| Ex. 10 | 75Co-20Pt-5Mn | 30 vol. % $Nb_2O_5$ | 3.93 | −2.03 | 1.99 | 5.96 | 11.02 |
| Comp. Ex. 6 | 80Co-20Pt | 30 vol. % $Ta_2O_5$ | 4.06 | −1.30 | 2.15 | 5.36 | 11.03 |
| Ex. 11 | 75Co-20Pt-5V | 30 vol. % $Ta_2O_5$ | 3.96 | −1.98 | 1.97 | 5.94 | 10.79 |
| Ex. 12 | 75Co-20Pt-5Mn | 30 vol. % $Ta_3O_5$ | 3.88 | −1.87 | 2.01 | 5.75 | 10.56 |

TABLE 5

Measured Results of Magnetic Characteristics (No. 2)

|  | Metal phase composition | Oxide phase composition | $H_c$ (kOe) | $H_n$ (kOe) | α | $H_c - H_n$ (kOe) | $K_u^{Grain}$ (×10⁶ erg/cm³) |
|---|---|---|---|---|---|---|---|
| Comp. Ex. 7 | 80Co-20Pt | 30 vol. % $MoO_3$ | 4.51 | −1.02 | 1.77 | 5.53 | 10.60 |
| Ex. 13 | 75Co-20Pt-5V | 30 vol. % $MoO_3$ | 4.31 | −1.56 | 1.54 | 5.87 | 10.45 |
| Ex. 14 | 75Co-20Pt-5Mn | 30 vol. % $MoO_3$ | 4.25 | −1.61 | 1.58 | 5.86 | 10.30 |
| Comp. Ex. 8 | 80Co-20Pt | 30 vol. % $WO_3$ | 4.58 | −0.90 | 1.78 | 5.48 | 10.04 |
| Ex. 15 | 75Co-20Pt-5V | 30 vol. % $WO_3$ | 4.20 | −1.64 | 1.69 | 5.84 | 9.65 |
| Ex. 16 | 75Co-20Pt-5Mn | 30 vol. % $WO_3$ | 4.15 | −1.66 | 1.70 | 5.81 | 9.53 |
| Comp. Ex. 9 | 80Co-20Pt | 15 vol. % $B_2O_3$-15 vol. % $SiO_2$ | 3.90 | −1.55 | 1.93 | 5.45 | 8.90 |
| Ex. 17 | 75Co-20Pt-5V | 15 vol. % $B_2O_3$-15 vol. % $SiO_2$ | 3.78 | −1.99 | 1.81 | 5.77 | 8.76 |
| Ex. 18 | 75Co-20Pt-5Mn | 15 vol. % $B_2O_3$-15 vol. % $SiO_2$ | 3.76 | −1.95 | 1.87 | 5.71 | 8.72 |
| Comp. Ex. 10 | 80Co-20Pt | 15 vol. % $SiO_2$-15 vol. % $TiO_2$ | 3.30 | −3.29 | 1.39 | 6.59 | 7.77 |
| Ex. 19 | 75Co-20Pt-5V | 15 vol. % $SiO_2$-15 vol. % $TiO_2$ | 3.30 | −3.41 | 1.36 | 6.71 | 7.81 |
| Ex. 20 | 75Co-20Pt-5Mn | 15 vol. % $SiO_2$-15 vol. % $TiO_2$ | 3.21 | −3.49 | 1.37 | 6.70 | 7.76 |
| Comp. Ex. 11 | 80Co-20Pt | 20 vol. % $B_2O_3$-5 vol. % $Cr_2O_3$ | 6.90 | −0.20 | 1.48 | 7.10 | 10.52 |
| Ex. 21 | 75Co-20Pt-5V | 20 vol. % $B_2O_3$-5 vol. % $Cr_2O_3$ | 7.02 | −0.77 | 1.37 | 7.79 | 10.03 |
| Ex. 22 | 75Co-20Pt-5Mn | 20 vol. % $B_2O_3$-5 vol. % $Cr_2O_3$ | 6.92 | −0.64 | 1.40 | 7.56 | 9.98 |
| Comp. Ex. 12 | 80Co-20Pt | 10 vol. % $SiO_2$-10 vol. % $TiO_2$-10 vol. % CoO | 3.60 | −4.08 | 1.39 | 7.68 | 9.75 |
| Ex. 23 | 75Co-20Pt-5V | 10 vol. % $SiO_2$-10 vol. % $TiO_2$-10 vol. % CoO | 3.56 | −4.39 | 1.34 | 7.95 | 9.41 |
| Ex. 24 | 75Co-20Pt-5Mn | 10 vol. % $SiO_2$-10 vol. % $TiO_2$-10 vol. % CoO | 3.44 | −4.41 | 1.35 | 7.85 | 9.40 |

TABLE 6

Measured Results of Magnetic Characteristics (No. 3)

| | Metal phase composition | Oxide phase composition | $H_c$ (kOe) | $H_n$ (kOe) | α | $H_c - H_n$ (kOe) | $K_u^{Grain}$ (×10⁶ erg/cm³) |
|---|---|---|---|---|---|---|---|
| Comp. Ex. 13 | 80Co-20Pt | 20 vol. % SiO₂-5 vol. % TiO₂-5 vol. % CoO | 3.30 | −3.50 | 1.43 | 6.80 | 11.02 |
| Ex. 25 | 75Co-20Pt-5V | 20 vol. % SiO₂-5 vol. % TiO₂-5 vol. % CoO | 3.41 | −3.73 | 1.34 | 7.14 | 10.89 |
| Ex. 26 | 75Co-20Pt-5Mn | 20 vol. % SiO₂-5 vol. % TiO₂-5 vol. % CoO | 3.38 | −3.69 | 1.38 | 7.07 | 10.00 |
| Comp. Ex. 14 | 80Co-20Pt | 20 vol. % B₂O₃-5 vol. % SiO₂-5 vol. % Cr₂O₃ | 4.50 | −1.05 | 1.95 | 5.55 | 11.50 |
| Ex. 27 | 75Co-20Pt-5V | 20 vol. % B₂O₃-5 vol. % SiO₂-5 vol. % Cr₂O₃ | 4.52 | −1.87 | 1.74 | 6.39 | 11.52 |
| Ex. 28 | 75Co-20Pt-5Mn | 20 vol. % B₂O₃-5 vol. % SiO₂-5 vol. % Cr₂O₃ | 4.47 | −1.77 | 1.76 | 6.24 | 11.31 |
| Comp. Ex. 15 | 80Co-20Pt | 20 vol. % B₂O₃-3 vol. % SiO₂-3 vol. % TiO₂-10 vol. % CoO | 5.40 | −1.62 | 1.35 | 7.02 | 10.00 |
| Ex. 29 | 75Co-20Pt-2V | 20 vol. % B₂O₃-3 vol. % SiO₂-3 vol. % TiO₂-10 vol. % CoO | 5.75 | −1.97 | 1.29 | 7.72 | 10.79 |
| Ex. 30 | 75Co-20Pt-2Mn | 20 vol. % B₂O₃-3 vol. % SiO₂-3 vol. % TiO₂-10 vol. % CoO | 5.60 | −1.80 | 1.32 | 7.40 | 10.40 |
| Ex. 31 | 79Co-20Pt-1V | 30 vol. % B₂O₃ | 6.53 | −0.21 | 1.63 | 6.74 | 11.89 |
| Ex. 32 | 79Co-20Pt-1Mn | 30 vol. % B₂O₃ | 6.50 | −0.18 | 1.64 | 6.68 | 11.78 |
| Ex. 33 | 70Co-20Pt-10V | 30 vol. % B₂O₃ | 4.20 | −2.10 | 1.45 | 6.30 | 10.40 |
| Ex. 34 | 70Co-20Pt-10Mn | 30 vol. % B₂O₃ | 3.80 | −2.37 | 1.56 | 6.17 | 9.80 |
| Comp. Ex. 16 | 65Co-20Pt-15V | 30 vol. % B₂O₃ | 1.80 | −3.53 | 1.63 | 5 33 | 7.50 |
| Comp. Ex. 17 | 65Co-20Pt-15Mn | 30 vol. % B₂O₃ | 1.40 | −3.60 | 1.68 | 5.00 | 7.12 |
| Comp. Ex. 18 | 75Co-20Pt-5Cr | 30 vol. % B₂O₃ | 6.67 | 0.42 | 1.65 | 6.25 | 11.50 |
| Ex. 35 | 75Co-20Pt-2Cr-3V | 30 vol. % B₂O₃ | 6.39 | −1.38 | 1.43 | 7.77 | 11.22 |
| Ex. 36 | 75Co-20Pt-2Cr-3Mn | 30 vol. % B₂O₃ | 6.07 | −1.60 | 1.50 | 7.67 | 11.00 |
| Comp. Ex. 19 | 75Co-20Pt-5Ru | 30 vol. % B₂O₃ | 6.50 | 0.10 | 1.63 | 6.40 | 11.30 |
| Ex. 37 | 75Co-20Pt-2Ru-3V | 30 vol. % B₂O₃ | 6.48 | −1.21 | 1.44 | 7.69 | 11.36 |
| Ex. 38 | 75Co-20Pt-2Ru-3Mn | 30 vol. % B₂O₃ | 6.31 | −1.38 | 1.46 | 7.69 | 11.23 |

The invention claimed is:

1. A sputtering target for a magnetic recording medium, comprising:
    a metal phase and an oxide phase,
    wherein the metal phase contains, based on total metal phase components of the sputtering target for a magnetic recording medium, 1 mol % or more and 30 mol % or less of Pt and 0.5 mol % or more and 10 mol % or less of at least one or more selected from Mn and V, with the balance being Co and incidental impurities,
    wherein the oxide phase contains O and one or more element(s) selected from a group consisting of: B, V, Ru, Ti, Si, Ta, Cr, Nb, Mn, Co, Ni, Zn, Y, Mo, W, La, Ce, Nd, Sm, Eu, Gd, Yb, Lu, and Zr,
    wherein the oxide phase contains at least B, and
    wherein, the sputtering target contains, based on the sputtering target for the magnetic recording medium as a whole, 25 vol % or more and 40 vol % or less of the oxide phase.

2. A sputtering target for a magnetic recording medium, comprising:
    a metal phase and an oxide phase,
    wherein the metal phase contains based on total metal phase components of the sputtering target for a magnetic recording medium, 1 mol % or more and 30 mol % or less of Pt, 0.5 mol % or more and 10 mol % or less of at least one or more selected from Mn and V, and more than 0.5 mol % and 30 mol % or less of at least one or more selected from Cr and Ru, with the balance being Co and incidental impurities,
    wherein the oxide phase contains at least B and O, and
    wherein, the sputtering target contains, based on the sputtering target for a magnetic recording medium as a whole, 25 vol % or more and 40 vol % or less of the oxide phase.

3. A sputtering target for a magnetic recording medium, comprising:
    a metal phase and an oxide phase,
    wherein the metal phase contains, based on total metal phase components of the sputtering target for a magnetic recording medium, 1 mol % or more and 30 mol % or less of Pt and 0.5 mol % or more and 10 mol % or less of at least one or more selected from Mn and V, with the balance being Co and incidental impurities,
    wherein the sputtering target contains, based on the sputtering target for a magnetic recording medium as a whole, 25 vol % or more and 40 vol % or less of the oxide phase, and
    wherein the oxide phase contains O and one or more element(s) selected from a group consisting of: B, V, Ru, Ti, Si, Ta, Cr, Nb, Mn, Co, Ni, Zn, Y, Mo, W, La, Ce, Nd, Sm, Eu, Gd, Yb, Lu, and Zr.

4. A sputtering target for a magnetic recording medium, comprising:
    a metal phase and an oxide phase,
    wherein the metal phase contains, based on total metal phase components of the sputtering target for a magnetic recording medium, 1 mol % or more and 30 mol % or less of Pt, 0.5 mol % or more and 10 mol % or less of at least one or more selected from Mn and V, and more than 0.5 mol % and 30 mol % or less of at least one or more selected from Cr and Ru, with the balance being Co and incidental impurities; and
    wherein the sputtering target contains, based on the sputtering target for a magnetic recording medium as a whole, 25 vol % or more and 40 vol % or less of an-oxide phase.

5. The sputtering target for a magnetic recording medium according to claim 2, wherein the oxide phase further contains an oxide of at least one element selected from V, Ru, Ti, Si, Ta, Cr, Al, Nb, Mn, Co, Ni, Zn, Y, Mo, W, La, Ce, Nd, Sm, Eu, Gd, Yb, Lu, and Zr.

6. The sputtering target for a magnetic recording medium according to claim 4, wherein the oxide phase contains an oxide of at least one element selected from B, V, Ru, Ti, Si, Ta, Cr, Al, Nb, Mn, Co, Ni, Zn, Y, Mo, W, La, Ce, Nd, Sm, Eu, Gd, Yb, Lu, and Zr.

7. The sputtering target for a magnetic recording medium according to claim 3, wherein the oxide phase contains $SiO_2$, $TiO_2$, $Cr_2O_3$, $Nb_2O_5$, $Ta_2O_5$, $MoO_3$, $WO_3$, $CoO$, $B_2O_3$, or any combinations thereof.

8. The sputtering target for a magnetic recording medium according to claim 4, wherein the oxide phase contains $SiO_2$, $TiO_2$, $Cr_2O_3$, $Nb_2O_5$, $Ta_2O_5$, $MoO_3$, $WO_3$, $CoO$, $B_2O_3$, or any combinations thereof.

* * * * *